United States Patent
Kashiwagi et al.

(10) Patent No.: US 8,841,689 B2
(45) Date of Patent: Sep. 23, 2014

(54) HEAT-CURABLE SILICONE RESIN SHEET HAVING PHOSPHOR-CONTAINING LAYER AND PHOSPHOR-FREE LAYER, METHOD OF PRODUCING LIGHT EMITTING DEVICE UTILIZING SAME AND LIGHT EMITTING SEMICONDUCTOR DEVICE OBTAINED BY THE METHOD

(71) Applicant: Shin-Etsu Chemical Co.; Ltd., Chiyoda-ku (JP)

(72) Inventors: Tsutomu Kashiwagi, Annaka (JP); Hayato Tanaka, Annaka (JP); Toshio Shiobara, Annaka (JP)

(73) Assignee: Shin-Etsu Chemical Co., Ltd., Chiyoda-ku (JP)

(*) Notice: Subject to any disclaimer, the term of this patent is extended or adjusted under 35 U.S.C. 154(b) by 0 days.

(21) Appl. No.: 13/742,794

(22) Filed: Jan. 16, 2013

(65) Prior Publication Data
US 2013/0200413 A1    Aug. 8, 2013

(30) Foreign Application Priority Data

Feb. 3, 2012 (JP) .................................. 2012-022264
Feb. 3, 2012 (JP) .................................. 2012-022265

(51) Int. Cl.
*H01L 33/00* (2010.01)
(52) U.S. Cl.
USPC ............. 257/98; 313/501; 313/502; 313/503; 313/504; 313/506
(58) Field of Classification Search
USPC ............................. 257/98; 313/501–504, 506
See application file for complete search history.

(56) References Cited

U.S. PATENT DOCUMENTS

| | | | |
|---|---|---|---|
| 2004/0094757 A1 | 5/2004 | Braune et al. | |
| 2004/0214966 A1 | 10/2004 | Tabei et al. | |
| 2008/0303411 A1* | 12/2008 | Ohta et al. | 313/503 |
| 2008/0308828 A1* | 12/2008 | Kashiwagi et al. | 257/98 |

FOREIGN PATENT DOCUMENTS

| | | |
|---|---|---|
| JP | 2004-339462 | 12/2004 |
| JP | 2005-524737 | 6/2005 |
| JP | 2008-19424 A | 1/2008 |
| JP | 2009-94351 | 4/2009 |
| JP | 2009-235368 A | 10/2009 |
| JP | 2010-123802 A | 6/2010 |
| JP | 2012-9469 A | 1/2012 |

OTHER PUBLICATIONS

Office Action issued Mar. 4, 2014 in Japanese Patent Application No. 2012-022264 (with English translation).
Office Action issued Mar. 4, 2014 in Japanese Patent Application No. 2012-022265 (with English translation).

* cited by examiner

*Primary Examiner* — Tan N Tran
(74) *Attorney, Agent, or Firm* — Oblon, Spivak, McClelland, Maier & Neustadt, L.L.P.

(57) ABSTRACT

Provided is a heat-curable silicone resin sheet that is able to easily uniformly disperse phosphors on an LED element surface, a method of producing a light emitting device utilizing the same and an encapsulated light emitting semiconductor device obtained by the method utilizing the same. The heat-curable silicone resin sheet includes at least the two layers of a layer 1 including a heat-curable silicone resin composition containing phosphors that is in a plastic solid state or a semi-solid state at room temperature, and a layer 2 including a transparent or a semi-transparent heat-curable silicone resin composition that is in a plastic solid state or a semi-solid state at room temperature.

17 Claims, 2 Drawing Sheets

US 8,841,689 B2

HEAT-CURABLE SILICONE RESIN SHEET HAVING PHOSPHOR-CONTAINING LAYER AND PHOSPHOR-FREE LAYER, METHOD OF PRODUCING LIGHT EMITTING DEVICE UTILIZING SAME AND LIGHT EMITTING SEMICONDUCTOR DEVICE OBTAINED BY THE METHOD

CROSS REFERENCES TO RELATED APPLICATIONS

This application claims priority to Japanese Patent Application No. 2012-022264, filed on Feb. 3, 2102, and Japanese Patent Application No. 2012-022265, filed on Feb. 3, 2012.

BACKGROUND OF THE INVENTION

1. Field of the Invention

The present invention relates to a heat-curable silicone resin sheet, which may be laminated on and bonded to the chip surface of an LED element, enabling conversion of the wavelength of blue light and ultraviolet light from the LED, and which has silicone resin layers of, at the very least, a phosphor-containing layer and a phosphor-free layer. The present invention also relates to a method of producing a light emitting device utilizing the resin sheet, and the light emitting device obtained by the same method.

2. Description of the Related Art

In the field of light emitting diodes (LED) the utilization of phosphors for wavelength conversion is known (Patent Document 1). Silicone resins are receiving attention as coating materials for the encapsulation and the protection of the LED element due to their excellent light resistance (Patent Document 2).

Generally, in white-colored LED elements, blue light is converted to a quasi-white light by dispersing phosphors in the vicinity of the chip in a method such as coating the LED chip with a silicone resin or an epoxy resin in which phosphors are dispersed. However, since color drift is likely to occur if the dispersion of the phosphors within the resin layer is not uniform or is uneven, it is necessary for the phosphors to be uniformly dispersed within the coating resin layer in order to produce a uniform white light. Consequently, a method in which a silicone resin composition containing phosphors is screen-printed has been investigated, for example. Furthermore, in another investigated method, after application of the composition to the chip followed by uniform dispersion of the phosphors in the vicinity of the chip through the precipitation to obtain a phosphor-dispersed layer, a transparent or semi-transparent protective layer is formed on the obtained layer. However, in this method, in addition to the insufficient stability of the quality of the obtained phosphor-dispersed layer and protective transparent layer, the complex production process is a problem. Furthermore, conventionally, the formation of the protective layer is performed by applying on the LED element a heat-curable silicone resin sheet containing the phosphors, curing thereof, and injecting a transparent resin into a mold. This method also has a problem of complex production process.

Furthermore, in an LED or the like, a high heat resistance and resistance to ultraviolet light is required for the resin layer coating the LED element. In addition, it will be convenient if the resin layer, in which the phosphors are uniformly dispersed, can be formed with conventional production apparatus.

Patent Document 1: Published Japanese Translation No. 2005-524737 of PCT International Publication.

Patent Document 2: Japanese Unexamined Patent Publication No. 2004-339482.

Patent Document 3: Japanese Unexamined Patent Publication No. 2009-094351.

SUMMARY OF THE INVENTION

Therefore, an objective of the present invention is to provide a heat-curable silicone resin sheet in which phosphors can be easily uniformly dispersed on an LED element surface.

A first aspect of the present invention, as a means for solving the problem, is to provide a heat-curable silicone resin sheet comprising a layer (2) including a heat-curable silicone resin composition that contains phosphors, and that is in a plastic solid or semi-solid state at room temperature, and a layer (1) including a heat-curable silicone resin composition that contains essentially no phosphors, and that is in a plastic solid or semi-solid state at room temperature.

The heat-curable silicone resin sheet of the present invention is able to be applied to an LED element surface to be cured by heating to encapsulate the LED element.

A second aspect of the present invention is to also provide a method of producing a light emitting device having an LED element, the method comprising: disposing a heat-curable silicone resin sheet on a surface of the LED element; and curing the resin sheet by heating to coat and encapsulate the LED element surface with a cured product having a cured silicone resin layer containing phosphors and a cured silicone resin layer containing essentially no phosphors.

Another aspect of the present invention is to provide a light emitting device in which the LED element is encapsulated with a cured product obtained by the above-mentioned production method, wherein the cured product has a cured silicone resin layer containing phosphors and a cured silicone resin layer containing essentially no phosphors.

As an example of a particularly preferable embodiment of the heat-curable silicone resin sheet of the present invention, the resin sheet comprises the layer (2) including the heat-curable silicone resin composition that contains:

(A-1) a resin-structured organopolysiloxane consisting essentially of $R^1SiO_{1.5}$ units, $R^2{}_2SiO$ units, and $R^3{}_aR^4{}_bSiO_{(4-a-b)/2}$ units, wherein $R^1$, $R^2$, and $R^3$ each independently represent a methyl group, an ethyl group, a propyl group, a cyclohexyl group, or a phenyl group, $R^4$ independently represents a vinyl group or an allyl group, a represents 0, 1, or 2, b represents 1 or 2, a+b is either 2 or 3, and at least a portion of the $R^2{}_2SiO$ units are consecutively repeated with a number of the repetitions in a range of 5 to 300;

(B-1) a resin-structured organohydrogenpolysiloxane consisting essentially of $R^1SiO_{1.5}$ units, $R^2{}_2SiO$ units, and $R^3{}_cH_dSiO_{(4-c-d)/2}$ units, wherein $R^1$, $R^2$, and $R^3$ each independently represent the groups as defined above, c represents 0, 1, or 2, d represents 1 or 2, c+d is either 2 or 3, and at least a portion of the $R^2{}_2SiO$ units are consecutively repeated with a number of the repetitions in a range of 5 to 300, wherein a molar ratio of hydrogen atoms bonded to silicon atoms within the component (B-1) with respect to the sum of the vinyl groups and the allyl groups within the component (A-1) is in a range of 0.1 to 4.0;

(C-1) an effective amount of at least one platinum group metal based catalyst for curing; and (D) at least one phosphor.

Further, the heat-curable silicone resin sheet comprises the layer (1) including the heat-curable silicone resin composition that contains essentially no phosphors, the composition containing:

(A-2) a resin-structured organopolysiloxane consisting essentially of $R^1SiO_{1.5}$ units, $R^2_2SiO$ units, and $R^3_aR^4_bSiO_{(4-a-b)/2}$ units, wherein $R^1$, $R^2$, and $R^3$ each independently represent a methyl group, an ethyl group, a propyl group, a cyclohexyl group, or a phenyl group, $R^4$ independently represents a vinyl group or an allyl group, a represents 0, 1, or 2, b represents 1 or 2, a+b is either 2 or 3, and at least a portion of the $R^2_2SiO$ units are consecutively repeated with a number of the repetitions in a range of 5 to 300;

(B-2) a resin-structured organohydrogenpolysiloxane consisting essentially of $R^1SiO_{1.5}$ units, $R^2_2SiO$ units, and $R^3_cH_dSiO_{(4-c-d)/2}$ units, wherein $R^1$, $R^2$, and $R^3$ each independently represent the groups as defined above, c represents 0, 1, or 2, d represents 1 or 2, c+d is either 2 or 3, and at least a portion of the $R^2_2SiO$ units are consecutively repeated with a number of the repetitions in a range of 5 to 300, wherein a molar ratio of hydrogen atoms bonded to silicon atoms within the component (B-2) with respect to the sum of the vinyl groups and the allyl groups within the component (A-2) is in a range of 0.1 to 4.0; and (C-2) an effective amount of at least one platinum group metal based catalyst for curing.

Since the heat-curable silicone resin sheet (since the sheet has at least two layers, it is hereunder also referred to as a two-layer heat-curable silicone resin sheet for the convenience of the description) of the present invention is a plastic solid or semi-solid in an uncured state so that it is easily handled and has a good workability, the resin sheet can be easily laminated and bonded to an LED element surface. Furthermore, since it is a plastic solid or semi-solid in an uncured state, the dispersion state of the filled phosphors is stable over time, and a resin layer in which the phosphors are uniformly dispersed without separation or precipitation from the resin during storage can be stably maintained.

In the case of the two-layer heat-curable silicone resin sheet of the present invention, since a phosphor layer and a protective layer (encapsulating layer) can be simultaneously formed by bonding only one sheet to the LED element surface, the productivity is significantly improved, and the mass productivity is excellent. The two-layer heat-curable silicone resin sheet can also be easily laminated and bonded to an LED element surface with a conventional mounting device, such as a die-bond mounter.

Moreover, by curing the composition sheet laminated in this manner, a cured resin layer in which the phosphors are uniformly dispersed can be efficiently and stably formed to have a uniform layer thickness. Furthermore, since the phosphors are uniformly dispersed in the obtained phosphor resin layer, a color drift is hard to occur, the color rendering is good, and a uniform white light can be obtained. Moreover, since the cured protective layer contains a white pigment, a light diffusion effect is obtained, glare is reduced, and additionally, at the time of non-illumination, the color of the phosphors are hidden by the white pigment, therefore the appearance is also good.

In a case where the composition of the preferable embodiment mentioned above is utilized, the cured product has an excellent flexibility unlike conventional cured resins, and forms a cured resin layer with a reduced surface tack. Additionally, the composition has an advantage that it is easily moldable with conventional molding apparatuses.

EMBODIMENTS OF THE INVENTION

Figure 1:
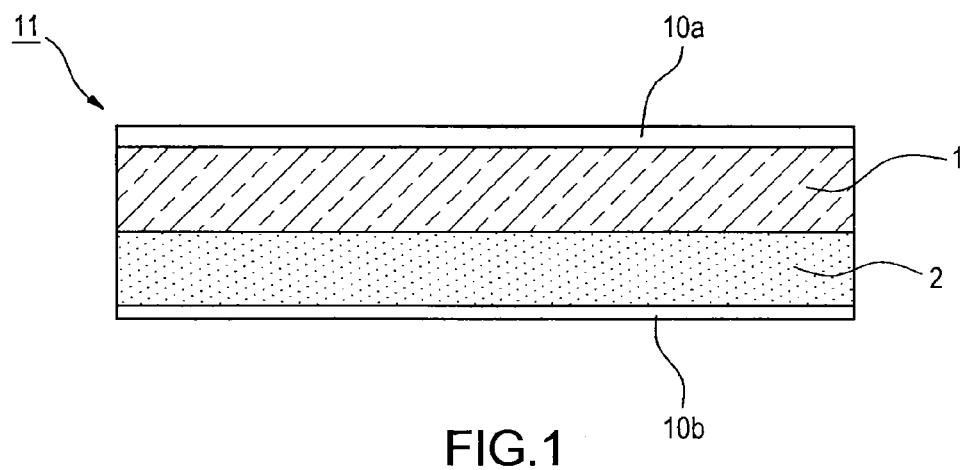
FIG. 1 is a cross-sectional view showing the structure of a heat-curable silicone resin sheet of the present invention produced in Example 1.

Hereunder, the present invention is described in further detail.

The heat-curable silicone resin sheet of the present invention includes at least a layer (1) and a layer (2), and both are plastic solids or semi-solids at room temperature. Here, the wording "room temperature" denotes the surrounding temperature in a normal state and is generally a temperature in the range of 15 to 30° C., and is typically 25° C. The wording "semi-solid" refers to a state of a material in which the material has a plastic property and the shape thereof is retained for at least 1 hour, or preferably 8 hours or more when molded to a specific shape. Therefore, when an intrinsically fluid material in a given shape reveals, due to its extremely high viscosity at room temperature, no change in the shape or no deformation recognizable to the naked eye in as short a time as one hour, the material is in a semi-solid state. Since it is in a solid or a semi-solid state, the composition is very easy to handle, and its workability is high. Furthermore, a good dispersion state of the phosphors is maintained over time in the layer (2).

Although the heat-curable silicone resin sheet of the present invention is in such a plastic solid or semi-solid state at room temperature, it begins to cure as a result of heating. In the curing process the resin sheet firstly softens. That is to say, a resin sheet in a solid state reveals a slight fluidity, whereas a resin sheet in a semi-solid state reveals an increased fluidity. As the process further proceeds, the viscosity increases again thereafter before the resin sheet is finally solidified.

In the present invention, the layer (2) contains the phosphors, and in addition to achieving a role of converting the wavelength of the light emitted from the LED element to a required wavelength, it coats the element and thus the element is protected and encapsulated. The layer (1) serves to increase the protection of the element. The layer (1) is transparent or semi-transparent. In the present application, the wording "transparent or semi-transparent" represents a light transmission of 80% or more in a wavelength region of, at the very least, 400 to 500 nm, or preferably 400 to 600 nm, or more preferably in a visible light region of 400 to 800 nm. Here, the light transmission is defined, by the ratio between the intensity of an incident light with a given wavelength into a sample sheet with a thickness of 100 μm and the intensity of the transmitted light through the sample sheet, i.e., $I/I_0$ (%) (wherein $I_0$ represents the intensity of the incident light, and I represents the intensity of the transmitted light).

Alternatively, the layer (1), in addition to being expected to improve the degree of whiteness of the emission from the layer (2) to diffuse the light from the layer (2), and to have a shielding effect to prevent the yellowish appearance of the LED, serves to increase the protection of the element.

For a good wavelength conversion performance can be obtained, generally, the thickness of the layer (2) is preferably 20 to 100 μm, and is more preferably 30 to 80 μm. Since the conversion performance also depends on the grain size of the phosphors and the dispersion concentration, taking the size and concentration into consideration is desirable for determining the thickness. If the amount of phosphors is too large, it becomes difficult to obtain white light from a blue colored LED, for example. Furthermore, in order to realize a certain thickness in which the phosphors are uniformly dispersed, not too small a thickness is preferable to facilitate the forming operation. The thickness of the layer (1), from aspect of element protection, is preferably 20 to 500 μm, more preferably 50 to 500 μm. Alternatively, the thickness of the layer (1), in view of the element protection, is preferably 20 to 300 μm, and is more preferably 30 to 200 μm.

In the following description, there are cases where the composition utilized for the layer (2) is referred to as composition (2), and the composition utilized for the layer (1) is referred to as composition (1). Me represents a methyl group, Et represents an ethyl group, Ph represents a phenyl group, and Vi represents a vinyl group.

Firstly, the components utilized according to the preferred embodiment described above for the composition (1) and the composition (2) are described. The descriptions of the components that are common to the composition (1) and the composition (2) are, unless specially noted, applicable to both the composition (1) and the composition (2).

(A) Alkenyl-Group-Containing Organopolysiloxane Having a Resin Structure—

The organopolysiloxane having a resin structure (that is to say, a three-dimensional network structure) that functions as the important component (A) of the composition of the present invention consists essentially of $R^1SiO_{1.5}$ units, $R^2_2SiO$ units, and $R^3_aR^4_bSiO_{(4-a-b)/2}$ units (wherein $R^1$, $R^2$, and $R^3$ each represent a methyl group, an ethyl group, a propyl group, a cyclohexyl group, or a phenyl group, $R^4$ represents a vinyl group or an allyl group, a represents 0, 1 or 2, b represents 1 or 2, and a+b is either 2 or 3), and partially includes a structure in which at least a portion of the $R^2_2SiO$ units are repeated with a number of repetitions thereof in a range of 5 to 300, preferably 10 to 300, more preferably 15 to 200, and even more preferably 20 to 100.

The structure in which at least a portion of the $R^2_2SiO$ units are repeated with a number of the repetitions in a range of 5 to 300 is expressed by the general formula (1):

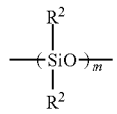

(1)

wherein m represents an integer of 5 to 300, and the general formula (1) represents a linear diorganopolysiloxane chain structure.

At least a portion, preferably 50 mol % or more (50 to 100 mol %), particularly 80 mol % or more (80 to 100 mol %), of all of the $R^2_2SiO$ units, which exist within the organopolysiloxane of the component (A), form a chain structure expressed by the general formula (1) within the molecule.

Within the molecule of the component (A), the $R^2_2SiO$ units serve to linearly stretch the polymer molecule, and the $R^1SiO_{1.5}$ units branch or three-dimensionally network the polymer molecule. The $R^4$ (vinyl group or allyl group) within the $R^3_aR^4_bSiO_{(4-a-b)/2}$ units, by undergoing a hydrosilylation addition reaction with the hydrogen atoms bonded to the silicon atoms (that is to say, the SiH groups) of the $R^3_cH_dSiO_{(4-c-d)/2}$ units of the component (B) mentioned below, achieve a role of curing the composition of the present invention.

The molar ratio of the necessary three types of siloxane units that constitute the component (A), that is to say, the molar ratio of the $R^1SiO_{1.5}$ units:$R^2_2SiO$ units:$R^3_aR^4_bSiO_{(4-a-b)/2}$ units is preferably, for the characteristics of the obtained cured product, 90 to 24:75 to 9:50 to 1, or more specifically, 70 to 28:70 to 20:10 to 2 (provided the sum is 100).

With regard to the $R^3_aR^4_bSiO_{(4-a-b)/2}$ units, it is preferable for the vinyl groups and the allyl groups within the organopolysiloxane to exist at a total of 0.001 mol/100 g or more, or more preferably 0.025 mol/100 g or more, or even more preferably 0.03 to 0.3 mol/100 g.

Furthermore, if the polystyrene-equivalent weight-average molecular weight of this component (A) according to gel permeation chromatography (GPC) is in a range of 3,000 to 1,000,000, or specifically 10,000 to 100,000, the polymer is in a solid or a semi-solid state and this is preferable in terms of the workability and the curability for example.

Such a resin-structured organopolysiloxane can be synthesized by combining the compounds that serve as sources of the respective units so that the produced polymer has each of the three types of siloxane units in a required ratio, and by performing co-hydrolysis-condensation in the presence of an acid, for example.

Examples of the raw material for the $R^1SiO_{1.5}$ units include chlorosilanes such as $MeSiCl_3$, $EtSiCl_3$, $PhSiCl_3$, propyltrichlorosilane, and cyclohexyltrichlorosilane, as well as alkoxysilanes, such as methoxysilanes, that correspond to these respective chlorosilanes.

Examples of the raw material for the $R^2_2SiO$ units include the compounds shown below:

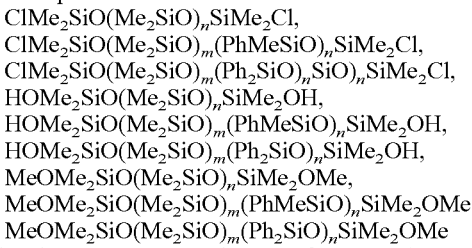

wherein m represents an integer of 5 to 150 (average value), and n represents an integer of to 300 (average value).

Furthermore, the $R^3_aR^4_bSiO_{(4-a-b)/2}$ units represent one type of siloxane unit or a combination of two or more siloxane units selected from $R^3R^4SiO$ units, $R^3_2R^4SiO_{0.5}$ units, $R^4_2SiO$ units, and $R^3R^4_2SiO_{0.5}$ units. As the raw materials thereof, chlorosilanes such as $Me_2ViSiCl$, $MeViSiCl_2$, $Ph_2ViSiCl$, $PhViSiCl_2$, and alkoxysilanes such as methoxysilanes that respectively correspond to these chlorosilanes can be exemplified.

In the present invention, the expression that the organopolysiloxane of the component (A) "consists essentially of $R^1SiO_{1.5}$ units, $R^2_2SiO$ units, and $R^3_aR^4_bSiO_{(4-a-b)/2}$ units" means that 90 mol % or more (90 to 100 mol %), or specifically 95 mol % or more (95 to 100 mol %) of the siloxane units that constitute the component (A) are represented by these three types of siloxane units, and that 0 to 10 mol %, or specifically 0 to 5 mol % may be represented by other siloxane units. Specifically, at the time the organopolysiloxane of the component (A) is produced by the co-hydrolysis and the condensation of the raw materials mentioned above, in addition to the $R^1SiO_{1.5}$ units, the $R^2_2SiO$ units, and/or the $R^3_aR^4_bSiO_{(4-a-b)/2}$ units, there are cases where siloxane units having silanol groups are formed as a by-product. The organopolysiloxane of the component (A) may be one containing these silanol group-containing siloxane units, in general, at approximately 10 mol % or less (0 to 10 mol %), or preferably 5 mol % or less (0 to 5 mol %) with respect to all of the siloxane units. Examples of the silanol group-containing siloxane units include $R^1(HO)SiO$ units, $R^1(HO)_2SiO_{0.5}$ units, $R^2_2(HO)SiO_{0.5}$ units, $R^3_aR^4_b(HO)SiO_{(3-a-b)/2}$ units, and $R^3_aR^4_b(HO)_2SiO_{(2-a-b)/2}$ units (wherein $R^1$ to $R^4$, a and b are each the same as defined above).

—(B) Organohydrogenpolysiloxane Having a Resin Structure—

The organohydrogenpolysiloxane having a resin structure (that is to say, the three-dimensional network structure) that functions as the important component (B) of the composition of the present invention consists essentially of $R^1SiO_{1.5}$ units, $R^2_2SiO$ units, and $R^3_cH_dSiO_{(4-c-d)/2}$ units (wherein $R^1$, $R^2$ and $R^3$ each represent the groups as defined above, c represents 0, 1 or 2, d represents 1 or 2, and c+d is either 2 or 3), and partially contains a linear siloxane structure in which at least a portion of the $R^2_2SiO$ are repeated with a number of repetitions thereof in a range of 5 to 300, or preferably 10 to 300, or more preferably 15 to 200, or even more preferably 20 to 100.

The structure in which at least a portion of the $R^2_2SiO$ units are repeated with a number of repetitions thereof in a range of 5 to 300, as described above in relation to the component (A), denotes that at least a portion of the $R^2_2SiO$ units, and preferably 50 mol % or more (50 to 100 mol %), and specifically 80 mol % or more (80 to 100 mol %) of the $R^2_2SiO$ units, which exist within the component (B), form a linear diorganopolysiloxane chain structure expressed by the general formula (1) within the molecule of the component (B).

Also within the molecule of the component (B), the $R^2_2SiO$ units serve to linearly stretch the polymer molecule, and the $R^1SiO_{1.5}$ units branch or three-dimensionally network the polymer molecule. The hydrogen atoms bonded to the silicon atoms within the $R^3_cH_dSiO_{(4c-d)/2}$ units, by undergoing a hydrosilylation addition reaction with the alkenyl groups possessed by the component (A), achieve a role of curing the composition of the present invention.

The molar ratio of the necessary three types of siloxane units that constitute the component, (B) that is to say, the molar ratio of the $R^1SiO_{1.5}$ units: $R^2_2SiO$ units: $R^3_cH_dSiO_{(4-c-d)/2}$ units is preferably, for the characteristics of the obtained cured product, 90 to 24:75 to 9:50 to 1, or more specifically, 70 to 28:70 to 20:10 to 2 (provided the sum is 100).

Furthermore, the polystyrene-equivalent weight-average molecular weight of this component (B) according to GPC is in the range of 3,000 to 1,000,000, or specifically 10,000 to 100,000, is preferable in view of the workability and the characteristics of the cured product for example.

Such a resin-structured organohydrogenpolysiloxane can be synthesized by combining the compounds that act as the raw materials of the respective units so that the three siloxane units become a required molar ratio within the produced polymer, and performing cohydrolysis-condensation.

Examples of the raw material for the $R^1SiO_{1.5}$ units include $MeSiCl_3$, $EtSiCl_3$, $PhSiCl_3$, propyltrichlorosilane, cyclohexyltrichlorosilane, and alkoxysilanes, such as methoxysilane, that correspond to these respective chlorosilanes.

Examples of the raw material for the $R^2_2SiO$ units include the compounds shown below.

$ClMe_2SiO(Me_2SiO)_nSiMe_2Cl$,
$ClMe_2SiO(Me_2SiO)_m(PhMeSiO)_nSiMe_2Cl$,
$ClMe_2SiO(Me_2SiO)_m(Ph_2SiO)_nSiMe_2Cl$,
$HOMe_2SiO(Me_2SiO)_nSiMe_2OH$,
$HOMe_2SiO(Me_2SiO)_m(PhMeSiO)_nSiMe_2OH$,
$HOMe_2SiO(Me_2SiO)_m(Ph_2SiO)_nSiMe_2OH$,
$MeOMe_2SiO(Me_2SiO)_nSiMe_2OMe$,
$MeOMe_2SiO(Me_2SiO)_m(PhMeSiO)_nSiMe_2OMe$, and
$MeOMe_2SiO(Me_2SiO)_m(Ph_2SiO)_nSiMe_2OMe$ wherein, m represents an integer of 5 to 150 (average value), and n represents an integer from 5 to 300 (average value).

Furthermore, the $R^3_cH_dSiO_{(4-c-d)/2}$ units represent one type of siloxane unit or an desired combination of two or more siloxane units selected from among $R^3HSiO$ units, $R^3_2HSiO_{0.5}$ units, $H_2SiO$ units, and $R^3H_2SiO_{0.5}$ units, and as the raw materials thereof, chlorosilanes such as $Me_2HSiCl$, $MeHSiCl_2$, $Ph_2HSiCl$, $PhHSiCl_2$, and alkoxysilanes such as methoxysilanes that respectively correspond to these chlorosilanes can be exemplified.

In the present invention, the expression that the organohydrogenpolysiloxane of the component (B) "consists essentially of $R^1SiO_{1.5}$ units, $R^2_2SiO$ units, and $R^3_cH_dSiO_{(4-c-d)/2}$ units" means that 90 mol % or more (90 to 100 mol %), or specifically 95 mol % or more (95 to 100 mol %) of the siloxane units that constitute the component (B) are represented by these three types of siloxane units, and that 0 to 10 mol %, or specifically 0 to 5 mol % may be represented by other siloxane units. Specifically, at the time the organopolysiloxane of the component (B) is produced by the co-hydrolysis and the condensation of the starting materials mentioned above, in addition to the $R^1SiO_{1.5}$ units, the $R^2_2SiO$ units, and the $R^3_cH_dSiO_{(4-c-d)/2}$ units, there are cases where siloxane units having silanol groups are formed via a secondary reaction. The organopolysiloxane of the component (B) may be one containing these silanol group-containing siloxane unit, in general, at approximately 10 mol % or less (0 to 10 mol %), or preferably 5 mol % or less (0 to 5 mol %) with respect to all of the siloxane units. Examples of the silanol group-containing siloxane units include $R^1(HO)SiO$ units, $R^1(HO)_2SiO_{0.5}$ units, $R^2_2(HO)SiO_{0.5}$ units, $R^3_cH_d(HO)SiO_{(3-c-d)/2}$ units, and $R^3_cH_d(HO)_2SiO_{(2-c-d)/2}$ units (wherein $R^1$ to $R^3$, c and d are each the same as defined above).

The amount of the added organohydrogenpolysiloxane of the component (B) is such that the molar ratio of the hydrogen atoms bonded to silicon atoms (SiH groups) within the component (B) with respect to the total amount of vinyl groups and allyl groups within the component (A) is 0.1 to 4.0, preferably 0.5 to 3.0, more preferably 0.8 to 2.0. If this ratio is less than 0.1, the curing reaction does not proceed, and it is difficult to obtain a silicone cured product. If the ratio exceeds 4.0, since a large amount of unreacted SiH groups remain within the cured product, it will change the physical properties of the cured product over time.

—(C) Platinum Group Metal-Comprising Catalyst—

This catalyst component is one that is added in order to promote the addition curing reaction of the composition of the present invention, and the examples include platinum-based, palladium-based, and rhodium-based catalyst. From the standpoint of cost, platinum systems such as platinum, platinum black, and chloroplatinic acid, or for example, $H_2PtCl_6.mH_2O$, $K_2PtCl_6$, $KHPtCl_6.mH_2O$, $K_2PtCl_4$, $K_2PtCl_4.mH_2O$, $PtO_2.mH_2O$, (m represents a positive integer) and complexes of these with hydrocarbons such as olefins, alcohols, or vinyl groups-containing organopolysiloxanes can exemplified the catalyst. These catalysts can be utilized alone as a single type or as a combination of two or more types.

The amount of the added component (C) may be an effective amount for curing, and generally, in terms of the mass of the platinum group metal relative to the total mass of the components (A) and (B), in the range of 0.1 to 500 ppm, preferably 0.5 to 100 ppm.

—(D) Phosphors—

Any known phosphors may be used as the phosphors of the component (D), and the amount added thereof is in general preferably in a range of 0.1 to 300 parts by mass, and is more preferably in a range of 10 to 300 parts by mass per 100 parts by mass of combination of all of the components (A) to (C) within the composition (2) included in the phosphor-containing layer (2). The composition (1) contains essentially no phosphors. The term, "contains essentially no phosphors," means that the composition (1) may contain a trace of phosphors as long as the heat-curable silicone resin sheet comprising the layer (1) including such resin composition (1) can still attain the objective of the present invention. The average particle size of the phosphors of the component (D) can be evaluated as a mass average value $D_{50}$ (or median size) of a particle size distribution measurement by means of the laser optical diffraction method. Generally, it is acceptable if the average particle size thereof is 10 nm or more, and those that are preferably 10 nm to 10 μm, or more preferably 10 nm to 1 μm are utilized.

It is acceptable if the phosphor material is one that absorbs the light from a semiconductor light emitting diode, which has a nitride type semiconductor as the light emitting layer, and performs wavelength conversion to light of a different wavelength for example. It is preferable if it is at least one or more selected from among nitride-based phosphors and oxynitride-based phosphors that are primarily activated by lanthanoid elements such as Eu and Ce, alkaline earth metal halogen apatite phosphors, alkaline earth metal halogen borate phosphors, alkaline earth metal aluminate phosphors, alkaline earth metal silicate phosphors, alkaline earth metal sulfide phosphors, alkaline earth metal thiogallate phosphors, alkaline earth metal silicon nitride phosphors, and germanate phosphors that are primarily activated by lanthanoid elements, such as Eu, or transition metal elements, such as Mn, or rare earth aluminate phosphors and rare earth silicate phosphors that are primarily activated by lanthanoid elements, such as Ce, or organic and organic complex phosphors that are primarily activated by lanthanoid elements, such as Eu, and Ca—Al—Si—O—N based oxynitride glass phosphors for example. Although the phosphors mentioned below can be utilized as a specific example, it is in no way limited to this. Hereunder, M represents at least one type of element selected from among Sr, Ca, Ba, Mg and Zn, X represents at least one type selected from among F, Cl, Br and I, and R represents Eu, Mn or a combination of Eu and Mn.

An example of a nitride-based phosphor that is primarily activated by lanthanoid elements, such as Eu and Ce, includes $M_2Si_5N_8$:Eu. Furthermore, in addition to $M_2Si_5N_8$:Eu, examples also include $MSi_7N_{10}$:Eu, $M_{1.8}Si_5O_{0.2}N_8$:Eu, and $M_{0.9}Si_7O_{0.1}N_{10}$:Eu.

An example of an oxynitride-based phosphor that is primarily activated by lanthanoid elements, such as Eu and Ce, includes $MSi_2O_2N_2$:Eu.

An example of an alkaline earth metal halogen apatite phosphor that is primarily activated by lanthanoid elements, such as Eu, or transition metal elements, such as Mn, includes $M_5(PO_4)_3X$:R.

An example of an alkaline earth metal halogen borate phosphor includes $M_2B_5O_9X$:R (M represents at least one element selected from among Sr, Ca, Ba, Mg and Zn. X represents at least one element selected from among F, Cl, Br and I. R represents at least one of Eu, Mn, and a combination of Eu and Mn.).

Examples of an alkaline earth metal aluminate phosphor include $SrAl_2O_4$:R, $Sr_4Al_{14}O_{25}$:R, $CaAl_2O_4$:R, $BaMg_2Al_{16}O_{27}$:R, $BaMg_2Al_{16}O_{12}$:R, and $BaMgAl_{10}O_{17}$:R (R represents at least one of Eu, Mn, and a combination Eu and Mn).

Examples of an alkaline earth metal sulfide phosphor include $La_2O_2S$:Eu, $Y_2O_2S$:Eu, and $Gd_2O_2S$:Eu.

Examples of a rare earth aluminate phosphor that is primarily activated by lanthanoid elements, such as Ce, include YAG phosphors represented by the compositional formula such as $Y_3Al_5O_{12}$:Ce, $(Y_{0.8}Gd_{0.2})_3Al_5O_{12}$:Ce, $Y_3(Al_{0.8}Ga_{0.2})_5O_{12})$:Ce, and $(Y,Gd)_3(Al,Ga)_5O_{12}$. Furthermore, examples also include $Tb_3Al_5O_{12}$:Ce, $Lu_3Al_5O_{12}$:Ce, in which a portion or all of the Y has been substituted by Tb and Lu for example.

Examples of other phosphors include ZnS::Eu, $Zn_2GeO_4$:Mn and $MGa_2S_4$:Eu.

The phosphors mentioned above may, as desired, be made to contain one or more selected from among Tb, Cu, Ag, Au, Cr, Nd, Dy, Co, Ni and Ti instead of Eu, or in addition to Eu.

The Ca—Al—Si—O—N based oxynitride glass phosphors are such that, in mol % representation, $CaCO_3$ is converted to CaO and is made 20 to 50 mol %, $Al_2O_3$ is made 0 to mol %, SiO is made 25 to 60 mol %, AlN is made 5 to 50 mol %, and a rare earth oxide or a transition metal oxide is made 0.1 to 20%, and are phosphors in which an oxynitride glass for which the total of the 5 components becomes 100 mol % is made the parent material. In phosphors in which an oxynitride glass is made the parent material, it is preferable for the nitrogen content to be 15 mass % or less, and in addition to the rare earth oxide ion, it is preferable to include, as a sensitizing agent, additional rare earth element ions within the phosphor glass as rare earth oxides with a content in the range of 0.1 to 10 mol % as a co-activator agent.

Furthermore, phosphors other than the phosphors mentioned above, that are phosphors having the same performance and effect, can also be utilized.

—(E) White Pigment—

A white pigment can be added into the silicone resin composition of the present invention. The white pigment of the component (E) is added as a light diffusing material and furthermore, as a white-colored colorant in order to increase the whiteness, and as the white pigment, titanium dioxide, alumina, rare earth oxides represented by yttrium oxide, barium sulfate, potassium titanate, zirconium oxide, zinc sulfide, zinc sulfate, zinc oxide, magnesium oxide and the like can be used as one type by itself or as a combination of several types. Since the white pigment increases the compatibility and the dispersibility between the resin and the inorganic fillers, surface treatment can be performed beforehand by a hydrous oxide of Al and Si for example. It is preferable to use titanium dioxide as the white pigment, and as the unit cell of this titanium dioxide, any one among the rutile type, the anatase type or the brucite type may be selected. Furthermore, the average particle size and shape are in no way limited, but the average particle size is preferably 50 nm to 5.0 μm. The average particle size can be evaluated as a mass average value $D_{50}$ (or median size) of a particle size distribution measurement by means of the laser optical diffraction method.

The addition of the white pigment within the component that constitutes the white pigment-containing layer (1) is preferably in a range of 0.05 to 10 parts by mass, or more preferably in a range of 0.1 to 5 parts by mass per 100 parts by mass of the component (A) and the component (B). If it is too little, there are cases where a sufficient light diffusion cannot be achieved. Furthermore, if it exceeds 10 parts by mass, the effect of blocking light may be so large as to decrease the brightness.

In a white-colored or a white-colored semi-transparent cured silicone resin layer containing essentially no phosphors and containing the white pigment, in the visible region, or more specifically, at least in the wavelength region of 400 to 500 nm, or preferably 400 to 600 nm, or more preferably in the 400 to 800 nm region, the light transmittance is preferably 50% or less, preferably 40 to 0.1%, and more preferably 30 to 0.5%. Here, the light transmission is defined, for light of a given specific wavelength for a sample sheet with a thickness of 100 μm, by the ratio $I/I_0$ (%) (wherein $I_0$ represents the strength of the incident light, and I represents the strength of the transmitted light) of the transmitted light strength with respect to the incident light strength.

—Other Components—

In addition to the components mentioned above, all types of additives that are themselves known may also be added to the composition of the present invention as needed.

Inorganic Filler:

An inorganic filler can be added to the layer (2) and/or the layer (1) with an object in reducing the thermal expansion coefficient. Examples of the inorganic filler include reinforcing inorganic fillers such as fumed silica, fumed titanium dioxide and fumed alumina, and non-reinforcing inorganic fillers such as fused silica, alumina, calcium carbonate, calcium silicate, titanium dioxide, ferric oxide, and zinc oxide. These inorganic fillers may, in total, be appropriately added in a range of 100 parts by mass or less (0 to 100 parts by mass) per total amount of 100 parts by mass of the components (A) and (B), and in a range in which the objects and the effects of the present invention are not compromised.

Adhesion Assistant:

Furthermore, in order to impart adhesivity, an adhesion assistant may be added as needed to the composition of the present invention. Examples of the adhesion assistant include linear or cyclic organosiloxane oligomers with 4 to 50, or preferably approximately 4 to 20 silicon atoms containing within a single molecule at least two types, or preferably two types or three types of functionalities selected from a hydrogen atom bonded to a silicon atom (a SiH group), an alkenyl group bonded to a silicon atom (a Si—CH=CH$_2$ group for example), an alkoxysilyl group (a trimethoxysilyl group for example), and an epoxy group (a glycidoxypropyl group or a 3,4-epoxycyclohexylethyl group for example), and an organooxysilyl-modified isocyanurate compound expressed by the general formula (2) and/or a hydrolysis-condensation products thereof (organosiloxane-modified isocyanurate compound).

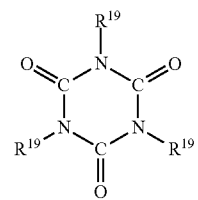

In the above formula, $R^{19}$ represents an organic group represented by formula (3) shown below:

(wherein $R^{20}$ represents a hydrogen atom or a monovalent hydrocarbon with 1 to 6 carbon atoms, s represents an integer of 1 to 6, and specifically 1 to 4), or a monovalent hydrocarbon group comprising an aliphatic unsaturated bond, provided that at least one of the $R^{19}$ groups is an organic group represented by formula (3).

Examples of the monovalent hydrocarbon group comprising an aliphatic unsaturated bond represented by $R^{19}$ in the general formula (2) include alkenyl groups with 2 to 8, or specifically 2 to 6 carbon atoms, such as a vinyl group, an allyl group, a propenyl group, an isopropenyl group, a butenyl group, an isobutenyl group, a pentenyl group, and a hexenyl group, and cycloalkenyl groups with 6 to 8 carbon atoms, such as a cyclohexenyl group. Furthermore, examples of the monovalent hydrocarbon group of $R^{20}$ in formula (3) include alkyl groups, such as a methyl group, an ethyl group, a propyl group, an isopropyl group, a butyl group, an isobutyl group, a tert-butyl group, a pentyl group, a hexyl group, and a cyclohexyl group, alkenyl groups and cycloalkenyl groups as exemplified with regard to $R^{19}$ above, and additionally, monovalent hydrocarbon groups with 1 to 8, or specifically 1 to 6 carbon atoms, such as aryl groups like a phenyl group, and is preferably an alkyl group.

Furthermore, as the adhesion assistant, 1,5-glycidoxypropyl-1,3,5,7-tetramethylcyclotetrasiloxane, 1-glycidoxypropyl-5-trimethoxysilylethyl-1,3,5,7-tetramethylcyclotetrasiloxane, and the compounds represented by the formulas below, are exemplified.

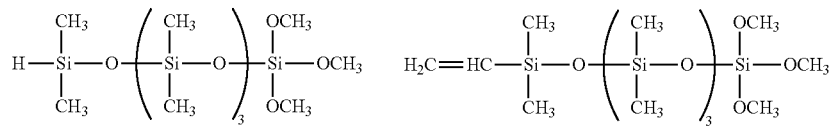

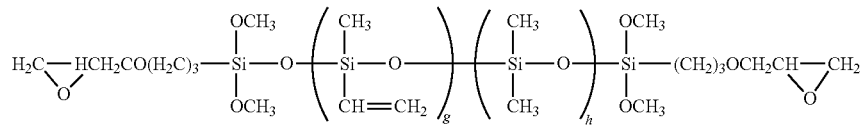

-continued

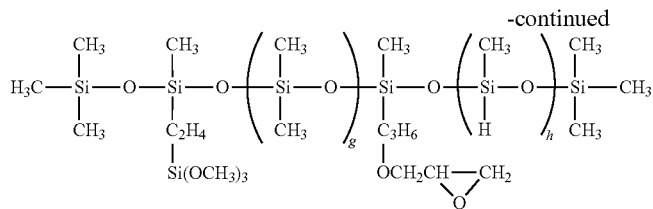

In the above formulas, each of g and h represents a positive integer in a range of 0 to 50, provided that additionally satisfy g+h is 2 to 50, and preferably 4 to 20.

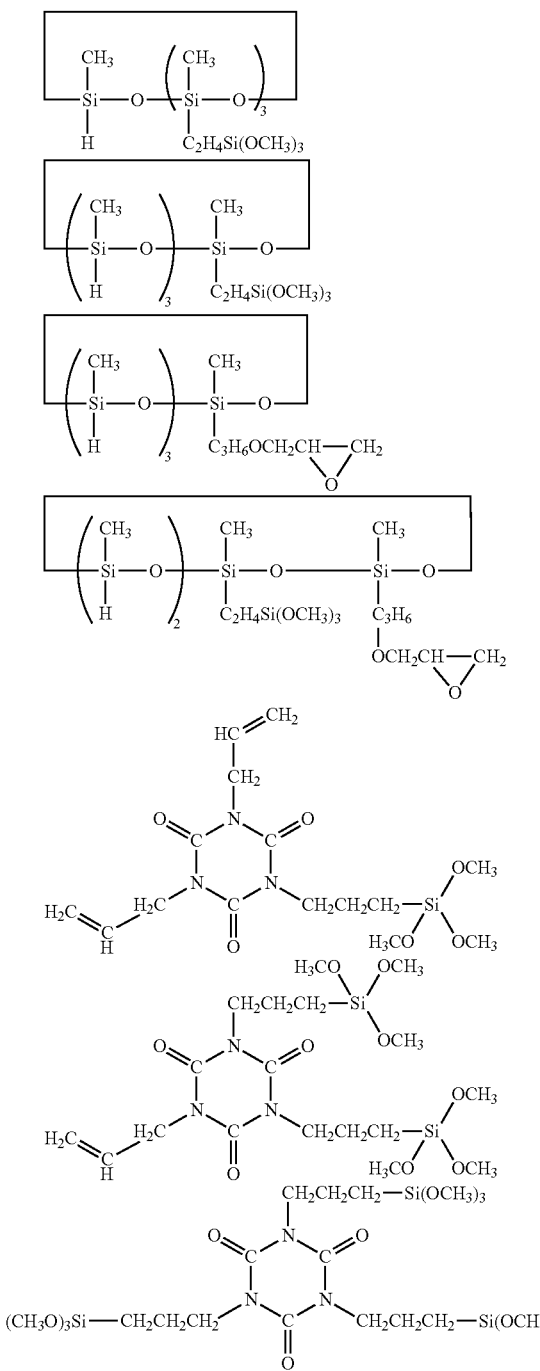

Among the organic silicon compounds mentioned above, the compounds that afford particularly good adhesivity to the obtained cured product are organic silicon compounds having a silicon atom bonded alkoxy group, and an alkenyl group or a silicon atom bonded hydrogen atom (a SiH group) within a single molecule.

For the amount added of the adhesion assistant is generally 10 parts by mass or less (that is to say, 0 to 10 parts by mass), and is preferably 0.1 to 8 parts by mass, and more preferably approximately 0.2 to 5 parts by mass, per 100 parts by mass of the component (A). If it is too much, there is a concern that adverse effects will be exerted on the hardness of the cured product, or that the surface tack will be increased.

Furthermore, a liquid silicone component can be added as required to an extent that the heat-curable silicone resin sheet of the present invention is maintained as a solid to semi-solid at room temperature and does not turn liquid. As such a liquid silicone component, one that has a viscosity of approximately 1 to 100,000 mPa·s at room temperature (25° C.) is preferable, and examples include vinylsiloxanes, hydrogensiloxanes, alkoxysilanes, hydroxysiloxanes and their mixtures. The added amount should meet the condition that the silicone composite sheet is maintained as a solid to semi-solid at room temperature, and is generally 50 mass % or less with respect to the silicone composite sheet as a whole.

Reaction Inhibitor:

An appropriate reaction inhibitor can be added to the composition of the present invention as required. The reaction inhibitor inhibits the curing reaction due to hydrosilylation, and is added to improve the preservability. Examples of the reaction inhibitor include compounds selected from the group including high vinyl group content organopolysiloxanes, such as tetramethyltetravinylcyclotetrasiloxane, triallylisocyanurates, alkylmaleates, acetylene alcohols and their silane modified compounds and siloxane modified compounds, hydroperoxides, tetramethylethylenediamine, and benzotriazole, and mixtures of these. The reaction inhibitor is added generally in a range of 0.001 to 1.0 parts by mass, preferably 0.005 to 0.5 parts by mass per 100 parts by mass of the component (A).

As one typical example of the composition of the present invention, a two-layer silicone resin sheet in which a phosphor-containing silicone resin sheet including the components (A) to (D) and a transparent or semi-transparent silicone resin sheet including the components (A) to (C) are bonded to each other may be provided.

As another typical example of the composition of the present invention, a two-layer silicone resin sheet in which a phosphor-containing silicone resin sheet consisting essentially of the components (A) to (D), and a white pigment-containing silicone resin sheet consisting essentially of the components (A) to (C) and (E) are bonded together can be given.

—Preparation and Curing Conditions—

By uniformly mixing, for the composition (2) utilized for the production of the silicone resin sheet of the present invention, the components (A) to (D) and optional components that are added as required, or for composition (1), the components (A) to (C) and optional components that are added as required, a phosphor-containing or phosphor-free silicone resin composition is respectively prepared. Generally, the compositions (1) and (2) are separated and stored as two liquids so that the curing does not proceed, and the two liquids are mixed at the time of use before proceeding to the next process. Of course, a reaction inhibitor such as an acetylene alcohol may be added in a small amount so that the two compositions can be provided as one liquid.

In order to produce the two-layer-laminated silicone resin sheet of the present invention, the phosphor-containing silicone resin composition (2) and the transparent heat-curable silicone resin composition (1) containing essentially no phosphors, or the white-colored heat-curable silicone resin composition (1), containing a white pigment, are individually processed on a release film into a sheet form by a film coater or a hot pressing machine.

Generally, the silicone resin composition containing phosphors is processed into a sheet form with a film coater or the like at a sheet thickness of preferably 20 to 100 µm.

On the other hand, although the transparent silicone resin composition (1), containing essentially no phosphors, is processed into a sheet form by the same method, the sheet thickness is preferably 20 to 500 µm. Alternatively, although the white-colored silicone resin composition (1), which contains a white pigment, is processed into a sheet form by the same method, the sheet thickness is preferably 20 to 300 µm. If it is too thin, it is not possible to protect the element or the gold wires that electrically connect the element and the leads, from external forces. As a protective layer, it is sufficient if it has a thickness of 500 µm or 300 µm, and if it is too thick, further effects cannot be anticipated and it is not desirable from cost reasons.

Here, by bonding the respective individually molding-processed two types of silicone resin sheets together with a hot laminator or a hot press, a two-layer silicone resin sheet having release films on the upper and lower surfaces can be produced. Furthermore, as another method, a film is firstly prepared with the phosphor-containing silicone resin composition (2), and the phosphor-free heat-curable silicone resin composition (1) can be prepared again thereupon by processing it into a sheet form by spray coating, with a film coater or a hot pressing machine. The produced two-layer silicone resin sheet is generally frozen and stored.

As examples of methods for encapsulating the LED element using the two-layer heat-curable silicone resin sheet obtained here, the following methods are described.

Figure 2A:
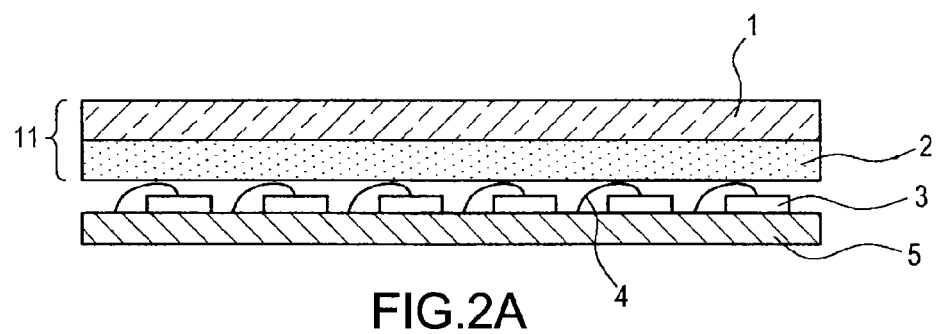
FIG. 2A is a conceptual cross-sectional view showing a state of a sheet 11 about to be bonded to a ceramic substrate 5 on which LED elements 3 are mounted.
Figure 2B:
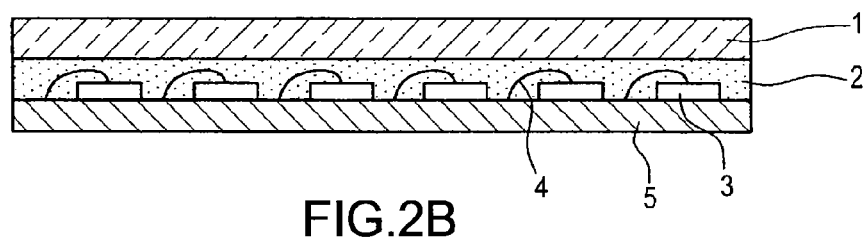
FIG. 2B is a conceptual cross-sectional view showing a state of the completed adhesion.

For example, as shown in FIG. 2 (A is a conceptual cross-sectional view showing a state of a sheet 11 about to be bonded to a ceramic substrate 5 on which LED elements 3 are mounted, and B is a conceptual cross-sectional view showing a state of the completed adhesion), following bonding of blue color LED elements 3 on a ceramic substrate 5 having an external connection terminal (not shown in the drawing) with a resin die-bond agent, the external connection terminal and the LED elements 3 are connected through gold wires 4. In order to encapsulate an LED device of this form, the two-layer silicone resin sheet of the present invention is bonded so that it coats the entire LED-mounted substrate, and encapsulates the entire LED elements as the sheet is cured by heating.

Although the silicone resin sheet 11 of the present invention is cured by heating, since it temporarily softens in the curing process, and the viscosity increases and proceeds towards solidification thereafter, it is possible to perform the encapsulation without imparting damage to the gold wires 4 even if it is bonded to the gold wires 4. Generally, a substrate 5 on which a plurality of LED elements 3 are mounted and encapsulated by this method is diced into separate pieces after the LED elements are coated by the silicone resin sheet and encapsulated with the cured resin. Even in an LED device in which the connection with the external terminal is connected with gold bumps instead of gold wires, it can be encapsulated in the same manner as the case of a gold wire connection.

Figure 3A:
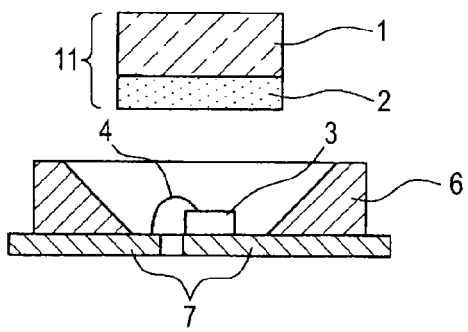
FIG. 3A is a cross-sectional view conceptually showing a state in which a sheet 11 of the present invention is attempted to be bonded to an external lead 7.

Furthermore, in the case of an LED element mounted within a reflector 6, as shown in FIG. 3 (A is a cross-sectional view conceptually showing a state in which a sheet 11 of the present invention is attempted to be bonded to an external lead 7, and B is a cross-sectional view conceptually showing a state in which it is bonded), the silicone resin sheet 11 including two layers is bonded so that the sheet 11 can coat the gold wire 4 connecting the LED element 3 and the external lead 7 before the sheet is cured by heating to encapsulate the LED element.

Moreover, since the transparent silicone protective layer can be simultaneously cured, compared to a conventional method in which a silicone resin containing phosphors is poured in a cast to precipitate the phosphors before curing, there is no color drift, and a uniform white light can be efficiently produced.

The cured silicone resin forms a flexible cured product with a high hardness and no surface tack, and since it includes a silicone resin layer containing phosphors and a transparent silicone resin layer, it can convert the blue light emitted from the LED to a uniform white light without color drift.

Alternatively, since the cured silicone resin forms a flexible cured product with a high hardness and no surface tack, and includes a silicone resin layer containing phosphors and a silicone resin layer containing a white pigment, in addition to being able to convert the blue light emitted from the LED to a uniform white light without color drift, since the white light can be diffused by the white pigment containing silicone resin layer, it is possible to emit a soft light that is gentle on the eyes. Furthermore, since the phosphor-containing silicone resin layer can be concealed by the white pigment containing silicone resin layer, the color of the phosphor-containing silicone resin layer is not visually recognized even at the time of non-illumination, and it becomes possible to produce an LED with a high aesthetic quality.

Figure 4A:
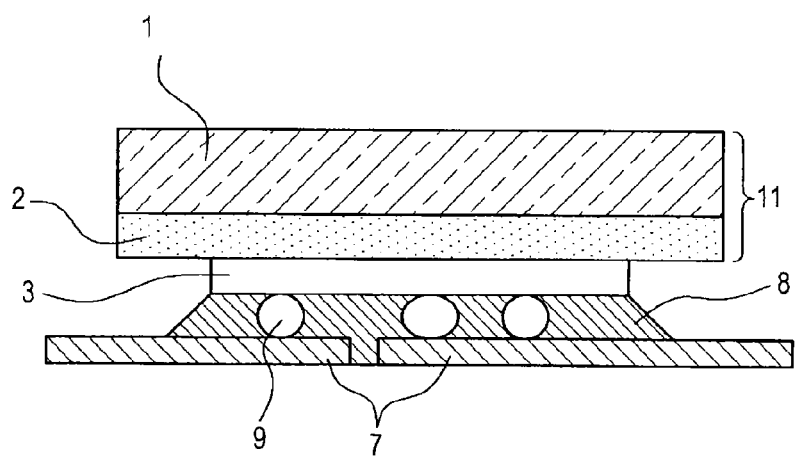
FIG. 4A is a cross-sectional view conceptually showing a state in which the encapsulation of an LED element bonded by the flip-chip method is attempted.
Figure 4B:
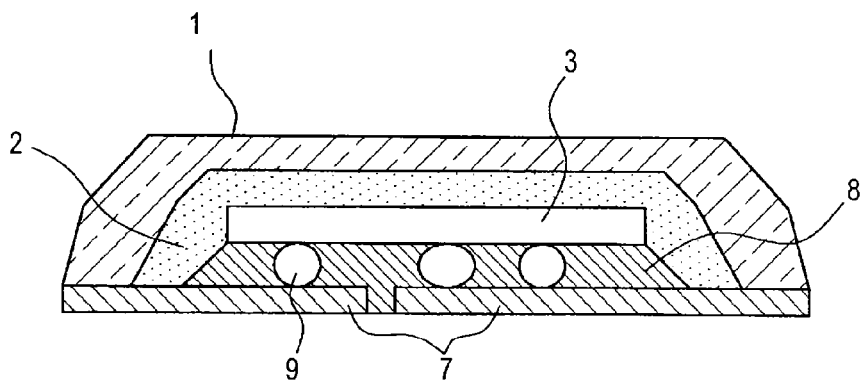
FIG. 4B is a cross-sectional view conceptually showing completed encapsulation.

In a case where the substrate and the LED element are bonded in the flip-chip method, as shown in FIG. 4, following bonding of the LED element 3 and the external lead 7 using a gold bump 9 or the like, an underfill material 8 including a silicone resin containing silica or the like, or an epoxy resin is injected and cured, and the protection of the bump 9 and the element 3 is performed. Thereafter, a silicone resin sheet 11 including two layers is bonded and the sheet is cured by heating. The color shade and the encapsulated shape can be controlled by adjusting the thickness of the phosphor-containing silicone resin layer 2 and the transparent or white pigment-containing silicone resin layer 1.

The pressure bonding of the two-layer silicone resin sheet onto the LED element can, in general, be performed at room temperature to 300° C. or less and under a pressure of MPa or less (generally 0.01 to 10 MPa), and preferably 5 MPa or less (0.1 to 5 MPa for example), and specifically 0.5 to 5 MPa.

Since the two-layer silicone resin sheet of the present invention is formed by a silicone resin in an A stage (uncured) state, it easily softens at the temperature mentioned above, and solidifies thereafter. Therefore, even in the case of LEDs that are connected by gold wires, encapsulation can be achieved without deforming the gold wires.

In a case where the viscosity in the A stage (uncured state) becomes too low at the time of heating, the resin sheet can be left under the environment of a temperature of 50° C. to 100° C. to promote the reaction beforehand until the desired viscosity is achieved. This provides an option among the embodiments available within the scope of the present invention.

Furthermore, it is most desirable for the silicone resin compositions (1) and (2) that form the two layers to be the same type of composition except that the former contains the component (D) (phosphors) and the latter, the component (E) (white pigments). In a case where the compositions (1) and (2) are not the same composition, desirably the difference in the softening temperatures of the respective resin compositions is preferably within 10° C., and more preferably within 5° C. However, depending on the structure of the LED, a large temperature difference may not be a problem. Here, "softening temperature" means the temperature at which the resin softens, i.e., a softening point. In the present invention the term means the softening temperature measured by, among various methods, the penetration method (a method in which the embedding process of a needle into the resin is observed, and the softening temperature is determined from the deformation of the sample) in thermomechanical analysis (TMA) using a device such as a SS6100 manufactured by Seiko Instrument Inc. The softening temperatures of the silicone resin compositions (1) and (2) are generally 35 to 100° C., and are preferably in the range of 40 to 80° C.

The curing is performed generally at 50 to 200° C., more specifically at 70 to 180° C., for 1 to 30 min, more specifically for 2 to 10 min. Furthermore, a postcuring at 50 to 200° C., specifically 70 to 180° C., for 0.1 to 10 h, specifically for 1 to 4 h may be performed.

EXAMPLES

Although, hereunder, by presenting Synthesis Examples, Preparation Examples, Examples and Comparative Examples, the present invention is described in detail, the embodiments of the present invention is in no way limited to the Examples described below. In the following examples, the viscosities are evaluated at 25° C. Furthermore, the weight-average molecular weights are polystyrene-equivalent values as measured by gel permeation chromatography (GPC).

Synthesis Example 1

Vinyl Group Containing Organopolysiloxane Resin (A1)

Following dissolution of an organosilane represented by $PhSiCl_3$: 27 mol, $ClMe_2SiO(Me_2SiO)_{33}SiMe_2Cl$: 1 mol, and $MeViSiCl_2$: 3 mol in a toluene solvent, the toluene solution was added dropwise into water. The resulting mixture underwent co-hydrolysis, washing with water, neutralization with alkali, removing water, and the solvent stripping to obtain the synthesized vinyl group containing resin (A1). The composition of this resin in terms of the constituent siloxane units and the structural unit represented by [—$SiMe_2$O-($Me_2SiO)_{33}$—$SiMe_2O_{2/2}$] is given by the formula: [$PhSiO_{3/2}]_{0.27}$[—$SiMe_2$O-($Me_2SiO)_{33}$—$SiMe_2O_{2/2}]_{0.01}$[$MeViSiO_{2/2}]_{0.03}$. The weight-average molecular weight of this resin was 62,000, and the melting point was 60° C.

Synthesis Example 2

Hydrosilyl Group Containing Organopolysiloxane Resin (B1)

Following dissolution of an organosilane represented by $PhSiCl_3$: 27 mol, $ClMe_2SiO(Me_2SiO)_{33}SiMe_2Cl$: 1 mol, and $MeHSiCl_2$: 3 mol in a toluene solvent, the toluene solution was added dropwise into water. The resulting mixture underwent co-hydrolysis, washing with water, neutralization with alkali, removing water, and the solvent stripping to obtain the synthesized hydrosilyl group containing resin (B1). The composition of this resin in terms of the constituent siloxane units and the structural unit represented by [—$SiMe_2$O-($Me_2SiO)_{33}$—$SiMe_2O_{2/2}$] is given by the formula: [$PhSiO_{3/2}]_{0.27}$[—$SiMe_2$O-($Me_2SiO)_{33}$—$SiMe_2O_{2/2}]_{0.01}$[$MeHSiO_{2/2}]_{0.03}$. The weight-average molecular weight of this resin was 58,000, and the melting point was 58° C.

Synthesis Example 3

Vinyl Group Containing Organopolysiloxane Resin (A2)

Following dissolution of an organosilane represented by $PhSiCl_3$: 27 mol, $ClMe_2SiO(Me_2SiO)_{33}SiMe_2Cl$: 1 mol, and $Me_2ViSiCl$: 3 mol in a toluene solvent, the toluene solution was added dropwise into water. The resulting mixture underwent co-hydrolysis, washing with water, neutralization with alkali, removing water, and the solvent stripping to obtain the synthesized vinyl group containing resin (A2). The composition of this resin in terms of the constituent siloxane units and the structural unit represented by [—$SiMe_2$O-($Me_2SiO)_{33}$—$SiMe_2O_{2/2}$] is given by the formula: [$PhSiO_{3/2}]_{0.27}$[—$SiMe_2$O-($Me_2SiO)_{33}$—$SiMe_2O_{2/2}]_{0.01}$[$Me_2ViSiO_{1/2}]_{0.03}$. The weight-average molecular weight of this resin was 63,000, and the melting point was 63° C.

Synthesis Example 4

Hydrosilyl Group Containing Organopolysiloxane Resin (B2)

Following dissolution of an organosilane represented by $PhSiCl_3$: 27 mol, $Cl_2SiO(Me_2SiO)_{33}SiMe_2Cl$: 1 mol, and $Me_2HSiCl$: 3 mol in a toluene solvent, the toluene solution was added dropwise into water. The resulting mixture underwent co-hydrolysis, washing with water, neutralization with alkali, removing water, and the solvent stripping to obtain the synthesized hydrosilyl group containing resin (B2). The composition of this resin in terms of the constituent siloxane units and the structural unit represented by [—$SiMe_2$O-($Me_2SiO)_{33}$—$SiMe_2O_{2/2}$] is given by the formula: [$PhSiO_{3/2}]_{0.27}$[—$SiMe_2$O-($Me_2SiO)_{33}$—$SiMe_2O_{2/2}]_{0.01}$[$Me_2HSiO_{1/2}]_{0.03}$. The weight-average molecular weight of this resin was 57,000, and the melting point was 56° C.

Preparation Example 1

Preparation Example of Composition (2)

With respect to 90 parts by mass of a base composition containing the vinyl group-containing organopolysiloxane resin of Synthesis Example 1 (A1): 189 g, the hydrosilyl group containing organopolysiloxane resin of Synthesis Example 2 (B1): 189 g, ethynylcyclohexanol, an acetylene alcohol as a reaction inhibitor: 0.2 g, and a platinic chloride octyl alcohol modified solution: 0.1 g, 10 parts by mass of a 5 μm particle size (average particle size) phosphor (YAG) was further added to the base composition. The mixture was thoroughly stirred in a warmed planetary mixer at 60° C. to prepare the silicone resin composition. This composition was a plastic solid at 25° C. The softening point of the obtained composition measured by the penetration method [utilized device: SS6100 manufactured by Seiko Instrument Inc] was 60° C.

Preparation Example 2-1

Preparation Example of Composition (2) (1)

A composition containing the vinyl group-containing organopolysiloxane resin of Synthesis Example 1 (A1): 189 g, the hydrosilyl group-containing organopolysiloxane resin of Synthesis Example 2 (B1): 189 g, ethynylcyclohexanol, an acetylene alcohol as a reaction inhibitor: 0.2 g, and a platinic chloride octyl alcohol modified solution: 0.1 g, was thoroughly stirred in a warmed planetary mixer at 60° C. to prepare the silicone resin composition was prepared. The composition was a plastic solid at 25° C. The softening point of the obtained composition measured in the same manner as Preparation Example 1 was 62° C.

Preparation Example 2-2

Preparation Example of Composition (2) (1)

With respect to 99 parts by mass of a base composition containing the vinyl group-containing organopolysiloxane resin of Synthesis Example 1 (A1): 189 g, the hydrosilyl group-containing organopolysiloxane resin of Synthesis Example 2 (B1): 189 g, ethynylcyclohexanol, an acetylene alcohol as a reaction inhibitor: 0.2 g, and a platinic chloride octyl alcohol modified solution: 0.1 g, 1 part by mass of titanium oxide (PF-691 manufactured by Ishihara Sangyo Kaisha Ltd.) was added to the base composition. The mixture was thoroughly stirred in a warmed planetary mixer at 70° C. to prepare the silicone resin composition (1). This composition was a plastic solid at 25° C. The softening point of the obtained composition measured in the same manner as Preparation Example 1 was 62° C.

Preparation Example 3

With respect to 90 parts by mass of, instead of the silicone resin composition prepared in Preparation Example 1, a commercially available addition-reaction-curing-type silicone varnish KJR-632 (the brand name, manufactured by Shin-Etsu Chemical Co. Ltd.), which has, as the base component, a vinyl group-containing organopolysiloxane resin containing no linear diorganopolysiloxane chain structure with a number of repeating units of 5 to 300, and being liquid at room temperature 10 parts by mass of the same 5 μm particle size (average particle size) phosphor (YAG) as Example 1 was added to the silicone varnish before the mixture was thoroughly stirred in a warmed planetary mixer at 60° C. to prepare a composition.

Preparation Example 4

With respect to 70 parts by mass of, instead of the vinyl group containing organopolysiloxane (A1) prepared in Synthesis Example 1, a commercially available addition-reaction-curing-type silicone varnish KJR-632L-1 (the brand name, manufactured by Shin-Etsu Chemical Co. Ltd.), which has, as the main component, a vinyl group-containing organopolysiloxane resin containing no linear diorganopolysiloxane chain structure with a number of repeating units of 5 to 300, and being liquid at room temperature 30 parts by mass of the same 5 μm particle size (average particle size) phosphor (YAG) as Example 1, was added to the silicone varnish before the mixture was thoroughly stirred in a warmed planetary mixer at 60° C. to prepare a composition.

Example 1-1

(1) Preparation of Phosphor-Containing Silicone Resin Sheet

The composition of Preparation Example 1 was sandwiched between two sheets of a fluororesin-coated PET film (release film), subjected to compressive molding using a hot pressing machine at 80° C. under a pressure of 5 t for 5 min, and molded into a sheet form with a thickness of 50 μm with the PET films attached to the both faces.

(2) Preparation of Transparent Silicone Resin Sheet

The composition of Preparation Example 2-1 was sandwiched between a PET film (base film for pressurization) and a fluororesin-coated PET film (release film), subjected to compressive molding using a hot pressing machine at 80° C. under a pressure of 5 t for 5 min, and molded into a sheet form with a thickness of 50 μm with the respective films attached to the two faces.

(3) Preparation of Two-Layer Silicone Resin Sheet

One of the release films of the phosphor-containing silicone resin sheet prepared in (1) was detached, and the release film of the transparent silicone resin sheet prepared in (2) was detached. Opposing the exposed resin faces of the respective sheets, they were bonded together in a state of no voids or gaps between them by pressurizing at a temperature of 40° C. with a sheet assembly equipment. The obtained two-layer silicone resin sheet was, as shown in FIG. 1, a sheet 11 in which the fluororesin-coated PET film 10b was bonded to the phosphor-containing silicone resin layer 2 side, and the PET film 10a was bonded to the transparent silicone resin layer 1 side.

Example 1-2

(1) Preparation of Phosphor-Containing Silicone Resin Sheet

The composition (2) of Preparation Example 1 was sandwiched between two sheets of an ETFE film (manufactured by Asahi Glass Co., the brand name: Aflex) (hereunder referred to as the "release film"), subjected to compressive molding using a hot pressing machine at 80° C. under a pressure of 5 t for 5 min, and molded into a sheet form with a thickness of 50 μm with the release films attached to the both faces.

(2) Preparation of White Pigment-Containing Silicone Resin Sheet

The composition of Preparation Example 2-2 was sandwiched between two sheets of a ETFE film, subjected to compressive molding using a hot pressing machine at 80° C. under a pressure of 5 t for 5 min, and molded into a sheet form with a thickness of 100 μm with the release films attached to the two faces.

(3) Preparation of Two-Layer Silicone Resin Sheet

One of the release films of the phosphor-containing silicone resin sheet prepared in (1) was detached, and one of the release films of the white pigment silicone resin sheet prepared in (2) was detached. Opposing the exposed resin faces of the respective sheets, they were bonded together in a state of no voids or gaps between them by pressurizing at a temperature of 40° C. with a sheet assembly equipment. The obtained two-layer silicone resin sheet was, as shown in FIG. 1, a sheet 11 in which the release films 10a and 10b were bonded to the outer face of both of the phosphor-containing silicone resin layer 2 and the white pigment-containing silicone resin layer 1.

Example 1-3

(1) Preparation of Phosphor-Containing Silicone Resin Sheet

The composition of Preparation Example 1 was sandwiched between two sheets of the release film, subjected to compressive molding using a hot pressing machine at 80° C. under a pressure of 5 t for 5 min, and molded into a sheet form with a thickness of 50 μm with the PET films attached to the both faces.

(2) Preparation of Transparent Silicone Resin Sheet

The composition of Preparation Example 2-1 was sandwiched between two sheets of the release film, subjected to compressive molding using a hot pressing machine at 80° C. under a pressure of 5 t for 5 min, and molded into a sheet form with a thickness of 50 μm with the films attached to the two faces.

(3) Preparation of Two-Layer Silicone Resin Sheet

One of the release films of the phosphor-containing silicone resin sheet prepared in (1) was detached, and one of the release films of the transparent silicone resin sheet prepared in (2) was detached. Opposing the exposed resin faces of the respective sheets, they were bonded together in a state of no voids or gaps between them by pressurizing at a temperature of 40° C. with a sheet assembly equipment. The obtained two-layer silicone resin sheet was, as shown in FIG. 1, a sheet 11 in which the release films 10a and 10b were bonded to the outer face of both of the phosphor-containing silicone resin layer 2 and the transparent silicone resin layer 1.

(4) Encapsulation of LED Element on Ceramic Substrate

The two-layer heat-curable silicone resin sheet obtained in (3) with the release films on it, was, as shown in FIG. 4A, cut into small pieces of a chip size. Following detachment of the release film from one face of the obtained sheet piece, the piece was mounted on a GaN-based LED element 3 so that the exposed phosphor-containing silicone resin face contacts the LED chip, then the release film was removed from the other face. During the subsequent heating at 150° C. for 5 minutes, the silicone resin sheet on the LED element briefly softened coating the entire LED element before the formation of the cured phosphor-containing resin layer 2 and transparent silicone resin layer 1. Secondary curing was performed by further heating the primarily cured layers at 150° C. for 60 min. In this manner, a light emitting semiconductor (LED) device with a flip-chip structure coated with the phosphor-containing silicone resin layer 2 and the transparent silicone resin layer 1 was prepared. In the drawing, 9 is a gold bump, and 8 represents a silicone underfill material containing 60 mass % of silica. The three LED elements each emitting light were prepared as samples, and the chromaticity coordinates were measured with an LED optical characteristics monitor (LE-3400) manufactured by Ohtsuka Electronics Co. The average value of the measured values of the three samples was obtained.

Preparation Example 5

Preparation Example of Composition (4) (2)

With respect to 70 parts by mass of a base composition containing the vinyl group-containing organopolysiloxane resin of Synthesis Example 3 (A2): 189 g, the hydrosilyl group-containing resin of Synthesis Example 4 (B2): 189 g, ethynylcyclohexanol, an acetylene alcohol as a reaction inhibitor: 0.2 g, and a platinic chloride octyl alcohol modified solution: 0.1 g, 30 parts by mass of a 5 μm particle size (average particle size) phosphor (YAG) was further added to the base compositions. The mixture was thoroughly stirred in a warmed planetary mixer at 60° C. to prepare the silicone resin composition. This composition was a plastic solid at 25° C. The softening point of the obtained composition measured in the same manner as Preparation Example 1 was 65° C.

Preparation Example 6-1

Preparation Example of Composition (2) (1)

A composition containing the vinyl group-containing resin of Synthesis Example 3 (A2): 189 g, the hydrosilyl group-containing resin of Synthesis Example 4 (B2): 189 g, ethynylcyclohexanol, an acetylene alcohol as a reaction inhibitor: 0.2 g, and a platinic chloride octyl alcohol modified solution: 0.1 g, was thoroughly stirred in a warmed planetary mixer at 60° C. to prepare the silicone resin composition. The composition was a plastic solid at 25° C. The softening point of the obtained composition measured in the same manner as Preparation Example 1 was 63° C.

Preparation Example 6-2

Preparation Example of Composition (1)

With respect to 99 parts by mass of a base composition containing the vinyl group-containing resin of Synthesis Example 3 (A2): 189 g, the hydrosilyl group-containing resin of Synthesis Example 4 (B2): 189 g, ethynylcyclohexanol, an acetylene alcohol as a reaction inhibitor: 0.2 g, and a platinic chloride octyl alcohol modified solution: 0.1 g, 1 part by mass of titanium oxide (PF-691 manufactured by Ishihara Sangyo Kaisha Ltd.) was added to the base composition. The mixture was thoroughly stirred in a warmed planetary mixer at 60° C. to prepare the silicone resin composition. The composition was a plastic solid at 25° C. The softening point of the obtained composition measured in the same manner as Preparation Example 1 was 63° C.

Example 2-1

(1) Preparation of Phosphor-Containing Silicone Resin Sheet

The composition of Preparation Example 5 was sandwiched between two sheets of a fluororesin-coated PET film (release film), subjected to compressive molding using a hot pressing machine for 5 min under a pressure of 5 t at 80° C., and molded into a sheet form with a thickness of 70 μm with the PET films attached to the both faces.

(2) Preparation of Transparent Silicone Resin Sheet

The composition of Preparation Example 6-1 was sandwiched between a PET film (base film for pressurization) and a fluororesin-coated PET film (release film), subjected to compressive molding using a hot pressing machine at 80° C. under a pressure of 5 t for 5 min, and molded into a sheet form with a thickness of 125 μm with the respective films attached to the two faces.

(3) Preparation of Two-Layer Silicone Resin Sheet

One of the release films of the phosphor-containing silicone resin sheet prepared in (1) and the release film of the transparent silicone resin sheet prepared in (2) were detached. Opposing the exposed resin faces of the respective sheets, they were bonded together in a state of no voids or gaps between them by pressurizing at a temperature of 40° C. with a sheet assembly equipment (hot lamination). The obtained two-layer silicone resin sheet was a sheet with a fluororesin-coated PET film on the phosphor-containing silicone resin layer side, and a PET film on the transparent silicone resin layer side.

Example 2-2

(1) Preparation of Phosphor-Containing Silicone Resin Sheet

The composition of Preparation Example 5 was sandwiched between two sheets of the release film, subjected to compressive molding using a hot pressing machine at 80° C. under a pressure of 5 t for 5 min, and molded into a sheet form with a thickness of 70 μm with the ETFE film attached to the both faces.

(2) Preparation of White Pigment-Containing Silicone Resin Sheet

The composition of Preparation Example 6-2 was sandwiched between two sheets of the release film, subjected to compressive molding using a hot pressing machine at 80° C. under a pressure of 5 t for 5 min, and molded into a sheet form with a thickness of 125 μm with the release films attached to the two faces.

(3) Preparation of Two-Layer Silicone Resin Sheet

One of the release films of the phosphor-containing silicone resin sheet prepared in (1) and one of the release films of the white pigment-containing silicone resin sheet prepared in (2) were detached. Opposing the exposed resin faces of the respective sheets, they were bonded together in a state of no voids or gaps between them by pressurizing at a temperature of 40° C. with a sheet assembly equipment (hot lamination). The obtained two-layer silicone resin sheet was a sheet in which the release films were bonded to the outer face of both of the phosphor-containing silicone resin and the white pigment containing silicone resin.

Example 3-1

Encapsulation of Ceramic Substrate LED Element

The two-layer heat-curable silicone resin sheet obtained in Example 1-1 with the release films on it, was, as shown in FIG. 4A, cut into small pieces of a chip size. Following detachment of the release film from one face of the obtained sheet piece, the piece was mounted on a GaN-based LED element 3 so that the exposed phosphor-containing silicone resin face contacts the LED chip, then the release film was removed from the other face. During the subsequent heating for 5 min at 150° C., the silicone resin sheet on the LED element briefly softened coating the LED element before the formation of the cured phosphor-containing resin layer 2 and transparent silicone resin layer 1. Secondary curing was performed by further heating the primarily cured layers at 150° C. for 60 min. In this manner, a light emitting semiconductor (LED) device with a flip-chip structure coated with the phosphor-containing silicone resin layer 2 and the transparent silicone resin layer 1 obtained in this manner was prepared. In the drawing, 9 is a gold bump, and 8 represents a silicone underfill material containing 60 mass % of silica. The three LED elements each emitting light were prepared as samples, and the chromaticity coordinates were measured with an LED optical characteristics monitor (LE-3400) manufactured by Ohtsuka Electronics Co. The average value of the measured values of the three samples was obtained.

Example 3-2

Encapsulation of LED Element on Ceramic Substrate

The two-layer heat-curable silicone resin sheet obtained in Example 1-2 with the release films on it, was, as shown in FIG. 4A, cut into small pieces of a chip size. Following detachment of the release film 10b from one face of the obtained sheet piece and after mounting the sheet piece, the piece was mounted on a GaN-based LED element 3 so that the exposed phosphor-containing silicone resin face contacts LED chip, then the release film 10a was removed from the other face. During the subsequent heating for 5 min at 150° C., the silicone resin sheet on the LED element, briefly softened coating the LED element before the formation of the cured phosphor-containing resin layer 2 and white pigment-containing silicone resin layer 1. Secondary curing was performed by further heating the primarily cured layers at 150° C. for 60 min. In this manner, a light emitting semiconductor (LED) device with a flip-chip structure coated with the phosphor-containing silicone resin layer 2 and the white pigment-containing silicone resin layer 1 was prepared. In the drawing, 9 is a gold bump, and 8 represents a silicone underfill material containing 60 mass % of silica. The three LED elements each emitting light were prepared as samples, and the chromaticity coordinates were measured by means of an LED optical characteristics monitor (LE-3400) manufactured by Ohtsuka Electronics Co. The average value of the measured values of the three samples was obtained.

Example 4-1

Encapsulation of LED Element Mounted Inside Reflector

Using the two-layer heat-curable silicone resin sheet obtained in Example 2-1, to encapsulate the GaN-based LED element 3 mounted in the reflector 6 shown in FIG. 3, the resin sheet was cut into small pieces into a chip size. Meanwhile the LED element 3 was bonded to, with a silicone resin die-bond agent, and mounted inside, the reflector 6, then connected to an external electrode (not shown in the drawing) with the gold wire 4.

Figure 3B:
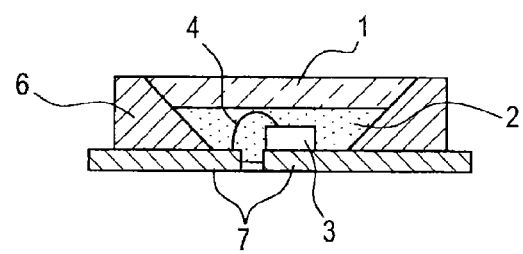
FIG. 3B is a cross-sectional view conceptually showing a state in which it is bonded

Following detachment of the release film from one face of the obtained sheet piece 11, the piece 11 was mounted on a GaN-based LED element 3 so that the exposed phosphor-containing silicone resin 2 surface contacts the LED chip, then the release film was removed from the other face. During the subsequent heating for 5 min at 150° C., the silicone resin sheet 11 on the LED 3, as shown in FIG. 3B, was cured to form the phosphor-containing resin layer 2 and the transparent silicone resin layer 1 coating the entire element. Secondary curing was performed by further heating the primarily cured layers at 150° C. for 60 min. In this manner, a reflector-installed light emitting semiconductor (LED) device coated with the phosphor-containing silicone resin layer 2 and the transparent silicone resin layer 1 obtained was prepared (FIG. 3B). The three LED elements each emitting light were prepared as samples, and the chromaticity coordinates were measured with an LED optical characteristics monitor (LE-3400) manufactured by Ohtsuka Electronics Co. The average value of the measured values of the three samples was obtained.

Example 4-2

Encapsulation of LED Element Mounted Inside Reflector

Using the two-layer heat-curable silicone resin sheet obtained in Example 2-2, to encapsulate the GaN-based LED element 3 mounted in the reflector 6 shown in FIG. 3, the resin sheet was cut into small pieces of a chip size. Meanwhile the LED element 3 was bonded to, with a silicone resin die-bond agent, and mounted inside, the reflector 6, then connected to an external electrode (not shown in the drawing) with the gold wire 4.

Following detachment of the release film from one face of the obtained sheet piece 11, the piece 11 was mounted on a GaN-based LED element 3 so that the exposed phosphor containing silicone resin 2 surface contacts the LED chip, then the release film was removed from the other face. During the subsequent heating for 5 min at 150° C., the silicone resin sheet 11 on the LED 3, as shown in FIG. 3B, was cured to form the phosphor-containing resin layer 2 and the white pigment-containing silicone resin layer 1 coating the entire element. Secondary curing was performed by further heating the primarily cured layers at 150° C. for 60 min. In this manner, a reflector-installed light emitting semiconductor (LED) device coated with the phosphor-containing silicone resin layer 2 and the white pigment-containing silicone resin layer 1 was prepared (FIG. 3B). The three LED elements each emitting light were prepared as samples, and the chromaticity coordinates were measured by means of an LED optical characteristics monitor (LE-3400) manufactured by Ohtsuka Electronics Co. The average value of the measured values of the three samples was obtained.

Comparative Example 1

A GaN-based LED element was bonded to, with a silicone resin die-bond agent, and mounted inside the reflector 6, then connected to an external electrode with the gold wire 4. Next, an amount of the silicone resin composition prepared in Preparation Example 4 that was able to coat the entire interior of the reflector was injected, and cured at 60° C. for 30 min, 120° C. for 1 h, and further at 150° C. for 1 h to prepare a light emitting semiconductor device. The three LED elements each emitting light were prepared as samples, and the chromaticity coordinates were measured by means of an LED optical characteristics monitor (LE-3400) manufactured by Ohtsuka Electronics Co. The average value of the measured values of the three samples was obtained.

Comparative Example 2

(1) Preparation of Phosphor-Containing Silicone Resin Sheet

The composition of Preparation Example 1 was sandwiched between two sheets of the release film, subjected to compressive molding using a hot pressing machine at 80° C. under a pressure of 5 t for 5 min, and molded into a sheet form with a thickness of 50 μm with the release films attached to the both faces.

(2) Encapsulation of LED Element on Ceramic Substrate

The phosphor-containing layer heat-curable silicone resin sheet obtained in (1) with the release films on it was cut into small pieces of a chip size. Following detachment of the release film from one face of the obtained sheet piece, the piece was, as shown in FIG. 4A, mounted on the sheet piece on a GaN-based LED element 3 so that the exposed phosphor-containing silicone resin face contacts the LED chip, then the release film was removed from the other face. During the subsequent heating for 5 min at 150° C., the silicone resin sheet on the LED element briefly softened coating the entire element before the formation of the cured phosphor-containing resin layer. Secondary curing was performed by further heating the primarily cured layer at 150° C. for 60 min. In this manner a light emitting semiconductor (LED) device with a flip-chip structure coated with only the phosphor-containing silicone resin layer obtained was prepared. In the drawing, 9 is a gold bump, and 8 represents a silicone underfill material containing 60 mass % of silica. The three LED elements each emitting light were prepared as samples, and the chromaticity coordinates were measured with an LED optical characteristics monitor (LE-3400) manufactured by Ohtsuka Electronics Co. The average value of the measured values of the three samples was obtained.

<Characteristic Evaluations>

Dispersion Properties of Phosphor within Two-Layer Silicone Sheet

Following curing of the 10 cm-sided two-layer silicone sheets prepared in Examples 1-1 and 2-1 at 120° C. for 30 min, and 150° C. for 1 h, the thickness of the phosphor layer and transparent layer in the cross sections of one hundred 1 cm-sided pieces cut out of the cured sheets was measured under a microscope. As a result, in the case of the two-layer silicone sheet of Example 1-1, the thickness of the phosphor layer was controlled to a range of 48 to 51 μm and the thickness of the transparent layer to 98 to 102 μm, and in the case of the sheet of Example 2-1, the phosphor layer to 67 to 71 μm and the thickness of the transparent layer to 122 to 126 μm.

Following curing of the 10 cm-sided two-layer silicone sheets prepared in Examples 1-2 and 2-2 at 120° C. for 30 min, and 150° C. for 1 h, the thickness of the phosphor layer and white pigment layer in the cross sections of one hundred 1 cm-sided pieces cut out of the cured sheets was measured under a microscope. As a result, in the case of the two-layer silicone sheet of Example 1-2, the thickness of the phosphor layer was controlled to a range of 48 to 51 μm and the thickness of the white pigment layer to 98 to 102 μm, and in the case of the sheet of Example 2-2, the phosphor layer to 67 to 71 μm and the thickness of the transparent layer to 122 to 126 μm.

Adhesion Force between Two-Layer Silicone Sheet

In order to measure the adhesion force between the two types of silicone sheets, i.e., the phosphor-containing sheet and phosphor-free sheet that respectively form the phosphor layer and the transparent layer, the silicone sheets of Examples 1-1 and 2-1 were cured at 120° C. for 30 min, and 150° C. for 1 h. Thereafter, the phosphor layer and the transparent layer were forced to be peeled apart. The two layers, however, were bonded so tightly that the cohesive failure occurred in the phosphor layer and the transparent layer.

In order to measure the adhesion force between the phosphor-containing silicone resin sheet and the phosphor-free and white pigment-containing silicone resin sheet that respectively form the phosphor layer and the white pigment layer, the silicone resin sheets of Examples 1-2 and 2-2 were cured at 120° C. for 30 min, and 150° C. for 1 h. Thereafter, the phosphor layer and the white pigment layer were forced to be peeled apart. The two layers, however, were bonded so tightly that the cohesive failure occurred in the phosphor layer and the white pigment layer.

Dispersion Properties of Phosphor within Light Emitting Semiconductor Device

In order to confirm the dispersion properties of the phosphors within a light emitting semiconductor device, 10 individual light emitting semiconductor devices mounted inside the reflectors prepared in Example 4-1 and Comparative Example 1 were respectively cut, and in the cross sections, the thicknesses of the phosphor distribution above the element were measured under a microscope. As a result, the phosphor layer uniformly dispersed 48 to 51 μm above the element surface in the case of Example 4-1, which utilized the two-layer silicone sheet. By contrast, in the case of Comparative Example 1, an insufficient precipitation was observed resulting in an uneven distribution of the phosphors, in which the phosphors were present below the level approximately 100 μm above the element, and the closer to the element, the denser was the phosphor distribution.

In order to confirm the dispersion properties of the phosphors within a light emitting semiconductor device, 10 individual light emitting semiconductor devices mounted inside the reflectors prepared in Example 4-2 and Comparative Example 1 were respectively cut, and in the cross sections, the thicknesses of the phosphor distribution above the element were measured under a microscope. As a result, the phosphor layer uniformly dispersed 48 to 51 μm above the element surface in the case of Example 4-2, which utilized the two-layer silicone sheet. By contrast, in the case of Comparative Example 1, an uneven distribution of the phosphors was observed, in which the phosphors were present below the level approximately 100 μm above the element, and the closer to the element, the denser was the phosphor distribution.

Measurement of Chromaticity Coordinates

Three of each of the light emitting semiconductor devices prepared in Examples 1-3, 3-2 and 4-2 each emitting light were prepared as samples, and the chromaticity coordinates were measured with an LED optical characteristics monitor (LE-3400) manufactured by Ohtsuka Electronics Co. The average value of the measured values of the three devices was obtained.

(Note: u', v': CIE 1976 chromaticity coordinates. This is based on the calculation method described in JIS Z 8726.)

TABLE 1

|  | Chromaticity Coordinate | |
| --- | --- | --- |
|  | u' | v' |
| Example 3-2 | 0.208 | 0.458 |
| Example 4-2 | 0.209 | 0.478 |
| Comparative Example 2 | 0.209 | 0.408 |
| Example 1-3 | 0.209 | 0.412 |

Comparing the values of v' for Examples 3-2 and 4-2 and Comparative Example 2, the values of v' of the light measured for Examples 3-2 and 4-2 were larger. Furthermore, comparing the values of v' for Examples 3-2 and 4-2 and Example 1-3, the values of v' of the light measured for Examples 3-2 and 4-2 were larger. From this, the value of v' can be made larger by bonding together a white-colored layer. This means that a small amount phosphors enables to produce a desired whiter light.

Furthermore, comparing the values of v' for Examples 3-2 and 4-2, the value of v' of the light measured for Example 4-2 is larger. From this, the value of v' can be adjusted by changing the conditions of the white-colored layer.

Generally, making the value of v' larger requires the amount of the filled phosphors to be increased. However, the above-mentioned results shows that by bonding with a white-pigment-containing layer, the targeted value of v' can be achieved with a smaller amount of phosphors.

Deviations in Chromaticity Coordinates

Three of each of the light emitting semiconductor devices prepared in Examples 3-1, 4-1 and Comparative Example 1 each emitting light were prepared as samples, and the deviations in the chromaticity coordinates were measured with an LED optical characteristics monitor (LE-3400) manufactured by Ohtsuka Electronics Co. The average value of the measured values of the three devices was obtained.

(Note: u': CIE 1976 chromaticity coordinate. This is based on the calculation method described in JIS Z 8726.)

TABLE 2

|  | Example | | Comparative Example |
| --- | --- | --- | --- |
| Characteristic Evaluation | 3-1 | 4-1 | 1 |
| Deviation in Chromaticity Coordinate[*] u' | ±0.001 | ±0.001 | ±0.006 |

[*]JIS Z 8729: L*u*v color system

By using the two-layer silicone sheet of the present invention, a light emitting semiconductor device whose light-emitting characteristics are uniform and without color drift can be obtained.

Three of each of the light emitting semiconductor devices prepared in Examples 3-2, 4-2 and Comparative Example 2 each emitting light were prepared as samples, and the variations in the chromaticity coordinates were measured with the (LE-3400) manufactured by Ohtsuka Electronics Co. The average value of the measured values of the three devices was obtained.

TABLE 3

|  | Variation in Chromaticity Coordinate | |
| --- | --- | --- |
|  | u' | v' |
| Example 3-2 | ±0.002 | ±0.004 |
| Example 4-2 | ±0.002 | ±0.004 |
| Comparative Example 2 | ±0.002 | ±0.004 |
| Example 1-3 | ±0.002 | ±0.004 |
| Comparative Example 1 | ±0.006 | ±0.010 |

Comparing the results of Examples 3-2 and 4-2 with the result of Comparative Example 2, it is understood that even if a white pigment-containing layer is bonded together, the extent of the variations in the chromaticity coordinates are almost unchanged.

Furthermore, comparing the results of Examples 3-2 and 4-2 with the result of Comparative Example 1, the variation for Examples 3-2 and 4-2 are smaller. Therefore, it is understood that by using the two-layer silicone resin sheet of the present invention, a light emitting semiconductor device whose light emitting characteristics are uniform and without color drift can be obtained.

Example 5

(1) Preparation of Silicone Resin Sheet

The composition of Preparation Example 2-1 was sandwiched between two sheets of the release film, subjected to compressive molding using a hot pressing machine at 80° C. under a pressure of 5 t for 5 min, and molded into a sheet form with a thickness of 50 μm with the ETFE films attached to the both faces.

(2) Preparation of White Pigment-Containing Silicone Resin Sheet

The composition of Preparation Example 6-2 was sandwiched between two sheets of the release film, subjected to compressive molding using a hot pressing machine at 80° C. under a pressure of 5 t for 5 min, and molded into a sheet form with a thickness of 50 μm in which respective films were attached to the two faces.

(3) Preparation of Two-Layer Silicone Resin Sheet

One of the release films of the phosphor-containing silicone resin sheet prepared in (1) was detached, and one of the release films of the white pigment-containing silicone resin sheet prepared in (2) was detached. Opposing the resin-exposed faces of the respective sheets, they were bonded together in a state of no voids or gaps between them by pressurizing at a temperature of 40° C. with a sheet assembly equipment (hot lamination). The obtained two-layer silicone resin sheet was a sheet in which the release films were bonded to the outer face of both of the phosphor-containing silicone resin layer and the white pigment-containing silicone resin layer.

Comparative Example 3

(1) Preparation of Transparent Silicone Resin Sheet

The composition of Preparation Example 2-1 was sandwiched between two sheets of the release film, subjected to compressive molding using a hot pressing machine at 80° C. under a pressure of 5 t for 5 min, and molded into a sheet form with a thickness of 100 μm with the respective films attached to the two faces.

Measurement of Optical Transmittance

The sample sheets with a thickness of 100 μm prepared in Example 5 and Comparative Example 3 were laminated on a glass plate, and the optical transmittance was measured using a spectrophotometer U-4100 (manufactured by Hitachi High-Technologies Corp.) at a scan rate of 200 nm/min and a scanning wavelength in a range of 300 nm to 800 nm. The measurement results of the optical transmittance at 450 nm and 750 nm are shown in Table 4.

TABLE 4

|  | Optical Transmittance at 450 nm [%] | Optical Transmittance at 750 nm [%] |
|---|---|---|
| Example 5 | 3.5 | 20.4 |
| Comparative Example 3 | 97.2 | 98.2 |

Comparing Example 5 and Comparative Example 3, the optical transmittance is lower in Example 5. This means that the light is diffused and scattered by the white pigment-containing layer of Example 5.

Furthermore, it is understood that the layer (1) of the sheet produced in Comparative Example 3 has a high transparency.

The heat-curable silicone resin sheet of the present invention is useful for coating and encapsulating light emitting elements, such as LED elements, and for producing light emitting devices.

What is claimed is:

1. A heat-curable silicone resin sheet comprising:
a layer (2) including a heat-curable silicone resin composition containing phosphors that is in a plastic solid or semi-solid state at room temperature; and
a layer (1) including a heat-curable silicone resin composition containing essentially no phosphors that is in a plastic solid or semi-solid state at room temperature,
wherein the layer (2) includes the heat-curable silicone resin composition containing:
(A-1) a resin-structured organopolysiloxane consisting essentially of $R^1SiO_{1.5}$ units $R^2{}_2SiO$ units, and $R^3{}_aR^4{}_bSiO_{(4-a-b)/2}$ units, wherein
$R^1$, $R^2$, and $R^3$ each independently represent a methyl group, an ethyl group, a propyl group, a cyclohexyl group, or a phenyl group,
$R^4$ independently represents a vinyl group or an allyl group,
a represents 0, 1, or 2,
b represents 1 or 2,
a+b is either 2 or 3, and
at least a portion of the $R^2{}_2SiO$ units are consecutively repeated, with a number of the repetitions in a range of 5 to 300;
(B-1) a resin-structured organohydrogenpolysiloxane consisting essentially of $R^1SiO_{1.5}$ units, $R^2{}_2SiO$ units, and $R^3{}_cH_dSiO_{(4-c-d)/2}$ units, wherein
$R^1$, $R^2$, and $R^3$ each independently represent the groups as defined above,
c represents 0, 1, or 2,
d represents 1 or 2,
c+d is either 2 or 3, and
at least a portion of the $R^2{}_2SiO$ units are consecutively repeated, with a number of the repetitions in a range of 5 to 300, wherein
a molar ratio of hydrogen atoms bonded to silicon atoms within component (B-1) with respect to the sum of the vinyl groups and the allyl groups within component (A-1) is in a range of 0.1 to 4.0;
(C-1) an effective amount of at least one platinum group metal based catalyst for curing; and
(D) at least one phosphor,
and the layer (1) includes the heat-curable silicone resin composition containing essentially no phosphors, the composition containing:
(A-2) a resin-structured organopolysiloxane consisting essentially of $R^1SiO_{1.5}$ units $R^2{}_2SiO$ units, and $R^3{}_aR^4{}_bSiO_{(4-a-b)/2}$ units, wherein R¹, R², and R³ independently represent a methyl group, an ethyl group, a propyl group, a cyclohexyl group, or a phenyl group, R⁴ independently represents a vinyl group or an allyl group, a represents 0, 1, or 2, b represents 1 or 2, a+b is either 2 or 3, and at least a portion of the $R^2{}_2SiO$ units are consecutively repeated, with a number of the repetitions in a range of 5 to 300;

(B-2) a resin-structured organohydrogenpolysiloxane consisting essentially of $R^1SiO_{1.5}$ units, $R^2{}_2SiO$ units, and $R^3{}_cH_dSiO_{(4-c-d)/2}$ units, wherein R¹, R², and R³ each independently represent the groups as defined above, c represents 0, 1, or 2, d represents 1 or 2, c+d is either 2 or 3, and at least a portion of the $R^2{}_2SiO$ units are consecutively repeated, with a number of the repetitions in a range of 5 to 300, wherein a molar ratio of hydrogen atoms bonded to silicon atoms within component (B-2) with respect to the sum of the vinyl groups and the allyl groups within component (A-2) is in a range of 0.1 to 4.0; and (C-2) an effective amount of at least one platinum group metal based catalyst for curing.

2. The heat-curable silicone resin sheet according to claim 1, wherein a thickness of the layer (2) is in a range of 20 to 100 μm, and a thickness of the layer (1) w is in a range of 20 to 500 μm.

3. The heat-curable silicone resin sheet according to claim 1, wherein, in the layer (2), the component (D) is in a range of 0.1 to 300 parts by mass per 100 parts by mass of the combination of all of the components (A-1) to (C-1).

4. The heat-curable silicone resin sheet according to claim 1, wherein, in the layer (2), a particle size of the phosphors of the component (D) is 10 nm or more.

5. The heat-curable silicone resin sheet according to claim 1, wherein a difference in the respective softening temperatures of the layer (1) and the layer (2) is within 10° C.

6. A silicone resin cured product obtained by thermal curing of the heat-curable silicone resin sheet according to claim 1 having at least the two layers of a cured silicone resin layer containing phosphors and a transparent or semi-transparent cured silicone resin layer containing essentially no phosphors, wherein the transparent or semi-transparent cured silicone resin layer containing essentially no phosphors has an optical transmittance of 80% or more at a wavelength at least in a range of 400 to 500 nm.

7. A method of producing a light emitting device having an LED element, the method comprising:
disposing the heat-curable silicone resin sheet according to claim 1 on a surface of the LED element; and
heat-curing the resin sheet to coat and encapsulate the LED element surface with a cured product having a cured silicone resin layer containing phosphors and a cured silicone resin layer containing essentially no phosphors.

8. A light emitting device obtained by the method according to claim 7, wherein the LED element is encapsulated by a cured product having a cured silicone resin layer containing phosphors and a cured silicone resin layer containing essentially no phosphors.

9. A heat-curable silicone resin, comprising:
a layer (2) including a heat-curable silicone resin composition containing phosphors that is in a plastic solid or semi-solid state at room temperature; and
a layer (1) including a heat-curable silicone resin composition containing essentially no phosphors that is in a plastic solid or semi-solid state at room temperature,
wherein the layer (2) includes the heat-curable silicone resin composition containing:
(A-1) a resin-structured organopolysiloxane consisting essentially of $R^1SiO_{1.5}$ units, $R^2{}_2SiO$ units, and $R^3{}_aR^4{}_bSiO_{(4-a-b)/2}$ units, wherein
R¹, R², and R³ each independently represent a methyl group, an ethyl group, a propyl group, a cyclohexyl group, or a phenyl group,
R⁴ independently represents a vinyl group or an allyl group,
a represents 0, 1, or 2,
b represents 1 or 2,
a+b is either 2 or 3, and
at least a portion of the $R^2{}_2SiO$ units are consecutively repeated, with a number of the repetitions in a range of 5 to 300;
(B-1) a resin-structured organohydrogenpolysiloxane consisting essentially of $R^1SiO_{1.5}$ units, $R^2{}_2SiO$ units, and $R^3{}_cH_dSiO_{(4-c-d)/2}$ units, wherein
R¹, R², and R³ each independently represent the groups as defined above,
c represents 0, 1, or 2,
d represents 1 or 2,
c+d is either 2 or 3, and
at least a portion of the $R^2{}_2SiO$ units are consecutively repeated, with a number of the repetitions in a range of 5 to 300, wherein
a molar ratio of hydrogen atoms bonded to silicon atoms within component (B-1) with respect to the sum of the vinyl groups and the allyl groups within component (A-1) is in a range of 0.1 to 4.0;
(C-1) at least one platinum group metal based catalyst; and
(D) at least one phosphor,
and the layer (1) includes a heat-curable silicone resin composition containing essentially no phosphors, the composition containing:
(A-2) a resin-structured organopolysiloxane consisting essentially of $R^1SiO_{1.5}$ units, $R^2{}_2SiO$ units, and $R^3{}_aR^4{}_bSiO_{(4-a-b)/2}$ units, wherein
R¹, R², and R³ each independently represent a methyl group, an ethyl group, a propyl group, a cyclohexyl group, or a phenyl group,
R⁴ independently represents a vinyl group or an allyl group,
a represents 0, 1, or 2,
b represents 1 or 2,
a+b is either 2 or 3, and
at least a portion of the $R^2{}_2SiO$ units are consecutively repeated, with a number of the repetitions in a range of 5 to 300;
(B-2) a resin-structured organohydrogenpolysiloxane consisting essentially of $R^1SiO_{1.5}$ units, $R^2{}_2SiO$ units, and $R^3{}_cH_dSiO_{(4-c-d)/2}$ units, wherein
R¹, R², and R³ each independently represent the groups as defined above,
c represents 0, 1, or 2,
d represents 1 or 2,
c+d is either 2 or 3, and at least a portion of the $R^2{}_2SiO$ units are consecutively repeated, with a number of the repetitions in a range of 5 to 300 units, wherein a molar ratio of hydrogen atoms bonded to silicon atoms within component (B-2) with respect to the sum of the vinyl groups and the allyl groups within component (A-2) is in a range of 0.1 to 4.0;

(C-2) at least one platinum group metal based catalyst; and (E) at least one white pigment.

10. The heat-curable silicone resin sheet according to claim 9, wherein a thickness of the layer (2) is in a range of 20 to 100 μm, and a thickness of the layer (1) is in a range of 20 to 300 μm.

11. The heat-curable silicone resin sheet according to claim 9, wherein, in the layer (2) the component (D) is in a range of 0.1 to 300 parts by mass per 100 parts by mass of the combination of all of the components (A-1) to (C-1).

12. The heat-curable silicone resin sheet according to claim 9, wherein, in the layer (2), a particle size of the phosphors of the component (D) is 10 nm or more.

13. The heat-curable silicone resin sheet according to claim 9, wherein, in the layer (1), the white pigment of the component (E) is in a range of 0.05 to 10 parts by mass per 100 parts by mass of a combination of all of the components (A-2) to (C-2).

14. The heat-curable silicone resin sheet according to claim 9, wherein, in the layer (1), an average particle size of the white pigment of the component (E) is 50 nm or more.

15. The heat-curable silicone resin sheet according to claim 9, wherein a difference in the respective softening temperatures of the layer (1) and the layer (2) is within 10° C.

16. A method of producing a light emitting device having an LED element, the method comprising:

disposing the heat-curable silicone resin sheet according to claim 9 on a surface of the LED element; and heat-curing the resin sheet to coat and encapsulate the LED element surface with a cured product having a cured silicone resin layer containing phosphors and a white-colored or white-colored semi-transparent cured silicone resin layer containing essentially no phosphors but containing a white pigment.

17. A light emitting device obtained by the method according to claim 16, wherein the LED element is encapsulated by a cured product having a cured silicone resin layer containing phosphors and a white-colored or white-colored semi-transparent cured silicone resin layer containing essentially no phosphors but containing a white pigment.

* * * * *

UNITED STATES PATENT AND TRADEMARK OFFICE
CERTIFICATE OF CORRECTION

PATENT NO. : 8,841,689 B2
APPLICATION NO. : 13/742794
DATED : September 23, 2014
INVENTOR(S) : Tsutomu Kashiwagi et al.

It is certified that error appears in the above-identified patent and that said Letters Patent is hereby corrected as shown below:

In the Specification

In column 19, line 5:
"Preparation Example of Composition (2) (1)"
should read as:
--Preparation Example of Composition (1)--

In column 19, line 18:
"Preparation Example of Composition (2) (1)"
should read as:
--Preparation Example of Composition (1)--

In column 22, line 8:
"Preparation Example of Composition (4) (2)"
should read as:
--Preparation Example of Composition (2)--

In column 22, line 23:
"Preparation Example of Composition (2) (1)"
should read as:
--Preparation Example of Composition (1)--

In the Claims

In column 30, line 31, claim 1:
"essentially of $R^1SiO_{1.5}$ units $R^2_2SiO$ units, and"
should read as:
--essentially of $R^1SiO_{1.5}$ units, $R^2_2SiO$ units, and--

Signed and Sealed this
Twenty-fourth Day of March, 2015

Michelle K. Lee
*Director of the United States Patent and Trademark Office*

CERTIFICATE OF CORRECTION (continued)
U.S. Pat. No. 8,841,689 B2

In column 30, line 52, claim 1:
"at least a portion of the $R^2,SiO$ units are consecutively"
should read as:
--at least a portion of the $R^2_2SiO$ units are consecutively--

In column 30, line 66, claim 1:
"essentially of $R^1SiO_{1.5}$ units $R^2,SiO$ units, and"
should read as:
--essentially of $R^1SiO_{1.5}$ units, $R^2_2SiO$ units, and--

In column 31, line 32, claim 2:
"µm, and a thickness of the layer (1) w is in a range of 20 to 500"
should read as:
--µm, and a thickness of the layer (1) is in a range of 20 to 500--